US012765261B2

(12) United States Patent
Yeh et al.

(10) Patent No.: US 12,765,261 B2
(45) Date of Patent: Oct. 13, 2026

(54) SEMICONDUCTOR STRUCTURE INCLUDING STRESS TUNING STRUCTURE AND METHOD FOR FORMING THE SAME

(71) Applicant: TAIWAN SEMICONDUCTOR MANUFACTURING COMPANY LTD., Hsinchu (TW)

(72) Inventors: Sheng Kai Yeh, Taichung City (TW); Chi-Yuan Shih, Hsinchu (TW); Shih-Fen Huang, Hsinchu County (TW); Wei Chun Wang, Taipei City (TW); Shao-Da Wang, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 798 days.

(21) Appl. No.: 18/315,477

(22) Filed: May 10, 2023

(65) Prior Publication Data

US 2024/0381776 A1 Nov. 14, 2024

(51) Int. Cl.
*H10N 30/20* (2023.01)
*H10N 30/082* (2023.01)
*H10N 30/50* (2023.01)

(52) U.S. Cl.
CPC ....... *H10N 30/2047* (2023.02); *H10N 30/082* (2023.02); *H10N 30/508* (2023.02)

(58) Field of Classification Search
CPC ............. H10N 30/2047; H10N 30/082; H10N 30/508; H10N 30/02; H04R 17/00; H04R 31/003
See application file for complete search history.

(56) References Cited

U.S. PATENT DOCUMENTS 5,940,947 A * 8/1999 Takeuchi ............... B41J 2/1637 29/25.35
10,913,093 B2 * 2/2021 Chau ...................... H10N 39/00

* cited by examiner

*Primary Examiner* — Emily P Pham
(74) *Attorney, Agent, or Firm* — WPAT Law; Anthony King

(57) ABSTRACT

A semiconductor structure includes a substrate, a piezoelectric layer, and a stress structure. The substrate includes a first surface and a second surface, wherein a portion of the substrate proximal to the first surface defines a diaphragm. The piezoelectric layer is disposed over the first surface of the substrate and surrounds the diaphragm, wherein the piezoelectric layer includes a first portion and a second portion arranged along a periphery of the diaphragm from a top view. The stress structure includes a plurality of dielectric layers disposed over the piezoelectric layer and between the substrate and the piezoelectric layer, and a total thickness of a first portion of the stress structure overlapping the first portion of the piezoelectric layer is different from a total thickness of a second portion of the stress structure overlapping the second portion of the piezoelectric layer. A method for manufacturing a semiconductor structure is also provided.

20 Claims, 33 Drawing Sheets

SEMICONDUCTOR STRUCTURE INCLUDING STRESS TUNING STRUCTURE AND METHOD FOR FORMING THE SAME

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, a fine-tuning method of a device according to properties of elements and/or materials of the device becomes critical.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
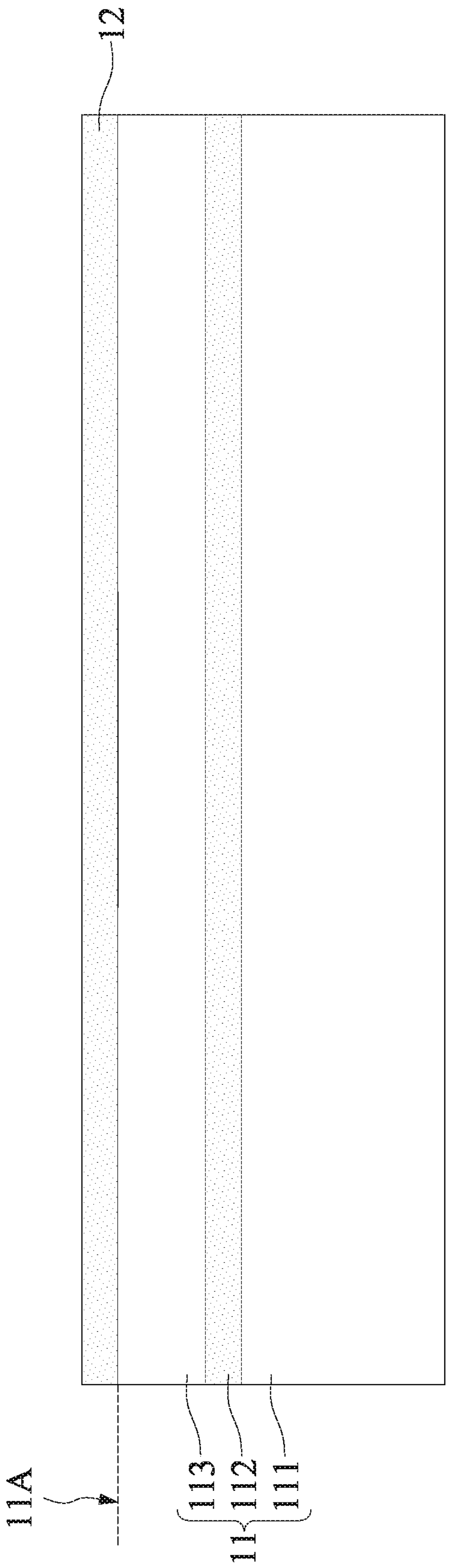
FIGS. 1 to 16 are schematic diagrams at different stages of a method for manufacturing a semiconductor structure in accordance with different embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below.” “lower.” “above.” “over,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as “first,” “second” and “third” describe various elements, components, regions, layers and/or sections, these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially.” “approximately” and “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially.” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With continuing size reductions in each new generation of semiconductor devices, precise control of properties of elements of the devices becomes an increasingly significant issue. A property of an element of a device can affect a performance of the device, and the property should be considered from many aspects. For instance, a total harmonic distortion (THD) correlates to deformation linearity of a speaker structure, and it is also a key index in examination of a quality of sound of the speaker. Typical operations of a piezoelectric micro-speaker requires DC (direct current) bias to prevent bi-polar fatigue of a piezoelectric material of the speaker in operations under AC (alternating current). Different DC biases move a membrane of the speaker deflected and positioned in different locations (a starting position of the membrane).

Traditionally, the THD is controlled by a design of the speaker, and a fixed value of a material property (e.g., d31 or d33) of a piezoelectric material of the speaker is used in calculation of the THD and the starting position of the membrane. However, through research, it has been discovered that d31/d33 of a piezoelectric material is affected by many aspects, and it changes with a voltage provided. It does not consider the voltage dependency of d31/d33 (it is assumed d31/d33 is voltage independent in current approach). In addition, uniformity of an element or a layer formed across a wafer is an issue to precise THD control. A center-edge non-uniformity across a wafer can result in geometric nonlinearity of the element/layer in different regions of the speaker (or different chips in different regions of the wafer). The voltage dependency of d31/d33 and the geometric nonlinearity are not considered together for model simplification in current approach, and thus sound quality of a speaker cannot be improved.

The present disclosure provides a semiconductor structure formed under a comprehensive consideration of the voltage dependency of d31/d33 and geometric nonlinearity. A method for forming the semiconductor structure is also provided. More specifically, a stress on the membrane is finely tuned according to a comprehensive result of d31/d33 and geometric effect of the membrane, and THD can be then optimized or finely tuned according to the comprehensive result. The semiconductor structure may include a film having different stresses or different thicknesses in different regions of the film or in different regions of the substrate, which the film is formed thereon. A sound quality of a speaker may then be optimized or improved by the finely tuned THD.

FIGS. 1 to 16 are schematic diagrams at different stages of a method for forming a MEMS (micro electro mechanical system) speaker in accordance with some embodiments of the present disclosure. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Referring to FIG. 1, a substrate 11 is provided, received, or formed. In some embodiments, the substrate 11 is a silicon-on-insulator (SOI). In some embodiments, the substrate 11 includes a bulk substrate 111, an insulator 112 and a silicon layer 113. The bulk substrate 111 can be a silicon wafer. In some embodiments, a dielectric layer 12 is formed over a first surface 11A of the substrate 11. In some embodiments, the dielectric layer 12 includes oxide, nitride, oxinitride, or a combination thereof.

Figure 2:
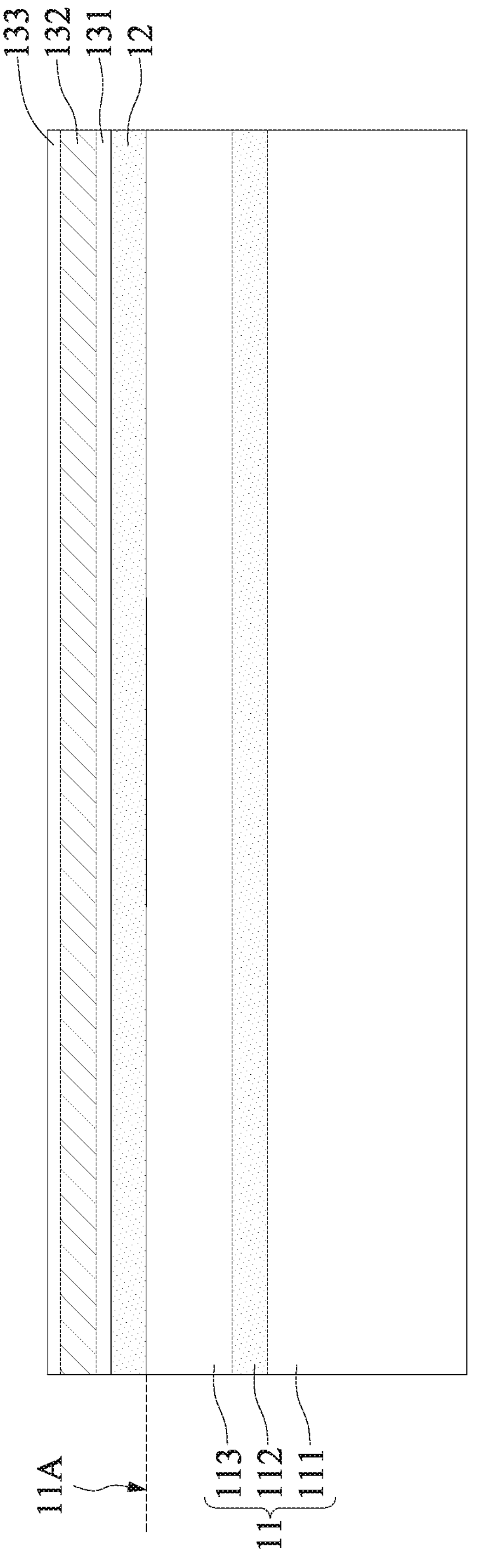
Figure 3:
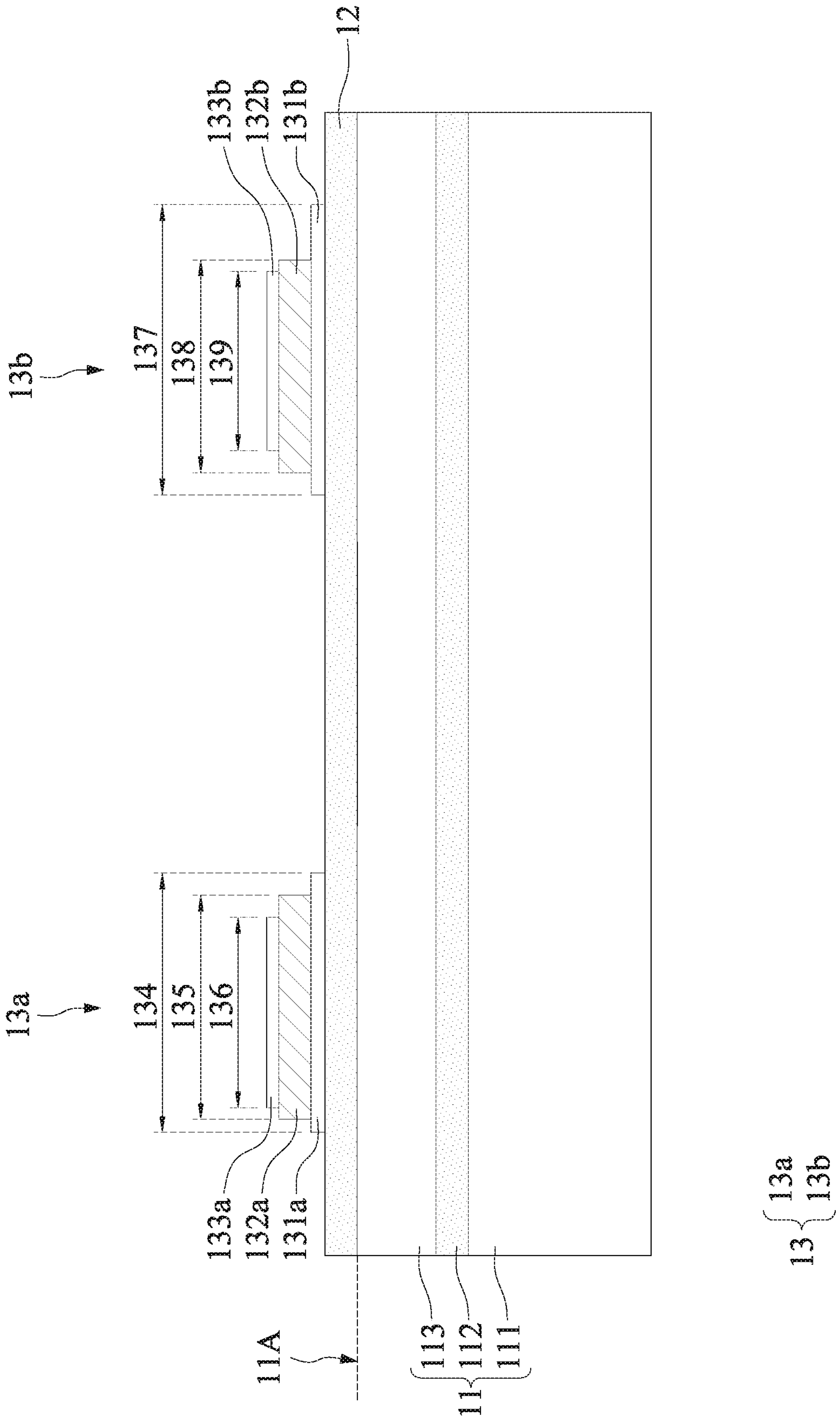

Referring to FIGS. 2 and 3, a piezoelectric capacitor 13*a* and/or a piezoelectric capacitor 13*b* are formed over the substrate 11. In some embodiments, the elements 13*a* and 13*b* represent different portions or segments of a piezoelectric capacitor. In some embodiments, the elements 13*a* and 13*b* represent two different piezoelectric capacitors. The formation of the piezoelectric capacitors 13*a* and 13*b* may include several steps.

As shown in FIG. 2, a first metal layer 131, a piezoelectric material layer 132 and a second metal layer 133 are formed in sequence over the first surface 11A of the substrate 11 and the dielectric layer 12. In some embodiments, each of the first metal layer 131, the piezoelectric material layer 132 and the second metal layer 133 is formed by a blanket deposition. In some embodiments, the first metal layer 131 and the second metal layer 133 include the same or different metallic materials. In some embodiments, the metallic material includes platinum (Pt), gold (Au), zinc (Zn), copper (Cu), ruthenium (Ru), or a combination thereof. In some embodiments, the piezoelectric material layer 132 includes quartz.

As shown in FIG. 3, the first metal layer 131, the piezoelectric material layer 132 and the second metal layer 133 are then patterned to form the piezoelectric capacitor 13*a* and the piezoelectric capacitor 13*b*. Different portions of the first metal layer 131 become bottom electrodes (or lower electrodes) of different piezoelectric capacitors after the patterning of the first metal layer 131. In some embodiments, a portion of the first metal layer 131 becomes a bottom electrode 131*a* of the piezoelectric capacitor 13*a* and another portion of the first metal layer 131 becomes a bottom electrode 131*b* of the piezoelectric capacitor 13*b*. Different portions of the piezoelectric material layer 132 become separators of different piezoelectric capacitors between the electrodes after patterning of the piezoelectric material layer 132. In some embodiments, a portion of the piezoelectric material layer 132 becomes a piezoelectric layer 132*a* of the piezoelectric capacitor 13*a* and another portion of the piezoelectric material layer 132 becomes a piezoelectric layer 132*b* of the piezoelectric capacitor 13*b*. Different portions of the second metal layer 133 become top electrodes (or upper electrodes) of different piezoelectric capacitors after the patterning of the second metal layer 133. In some embodiments, a portion of the second metal layer 133 becomes a top electrode 133*a* of the piezoelectric capacitor 13*a* and another portion of the second metal layer 133 becomes a top electrode 133*b* of the piezoelectric capacitor 13*b*. It should be noted that in alternative embodiments the capacitors 13*a* and/or 13*b* are another type of capacitors, the piezoelectric material layer 132 includes a dielectric material, such as oxide, nitride, oxynitride, or a combination thereof.

Figure 4:
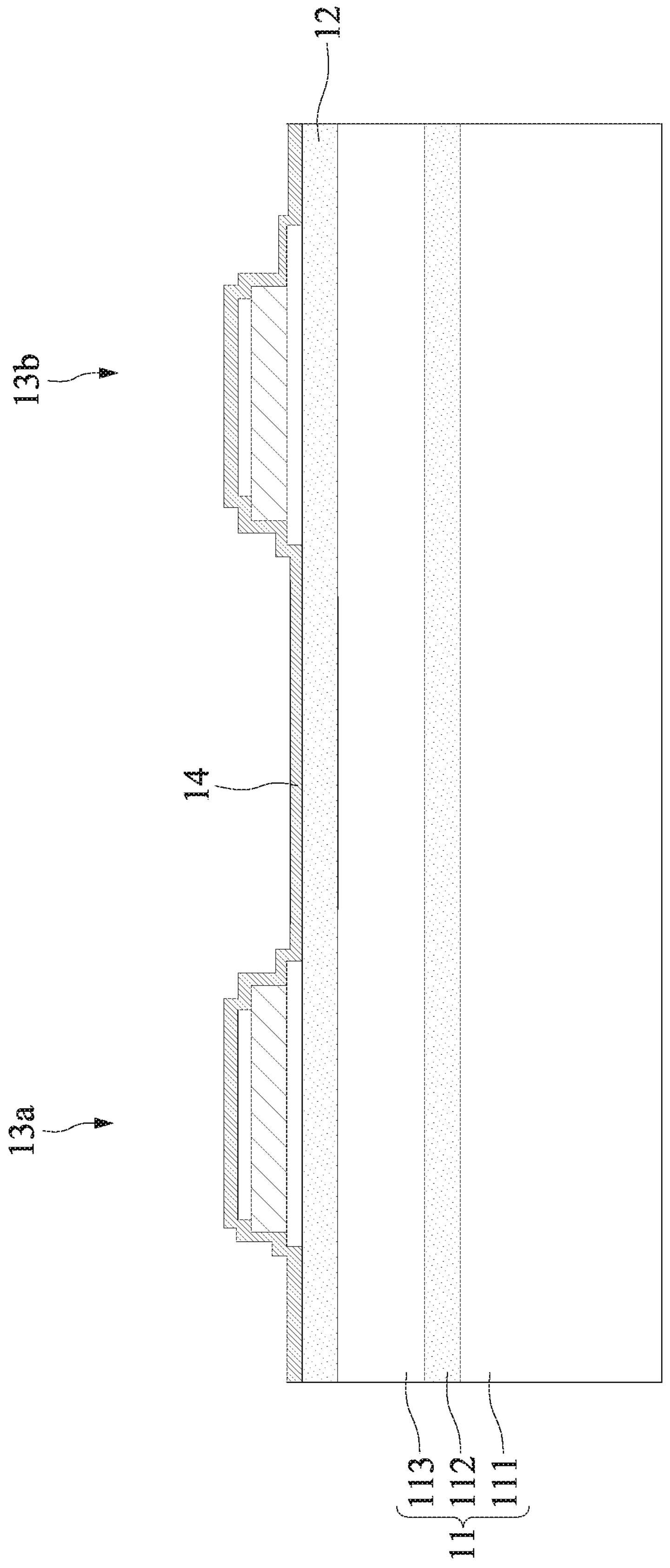

Referring to FIG. 4, a high-k material layer 14 is formed conformally over the piezoelectric capacitors 13*a* and 13*b*. In some embodiments, the high-k material layer 14 is formed by a conformal deposition. In some embodiments, the high-k material layer 14 includes a material having a dielectric constant k greater than 3.9. In some embodiments, the high-k material layer 14 includes hafnium oxide ($HfO_2$), hafnium silicate ($HfSiO_4$), hafnium silicon oxynitride (HfSiON), hafnium tantalum oxide (HfTaO), hafnium titanium oxide (HfTiO), hafnium zirconium oxide (HfZrO), zirconium oxide, aluminum oxide, titanium oxide, hafnium dioxide-alumina ($HfO_2$—$Al_2O_3$) alloy, other suitable high-k dielectric materials, and/or combinations thereof.

Figure 5:
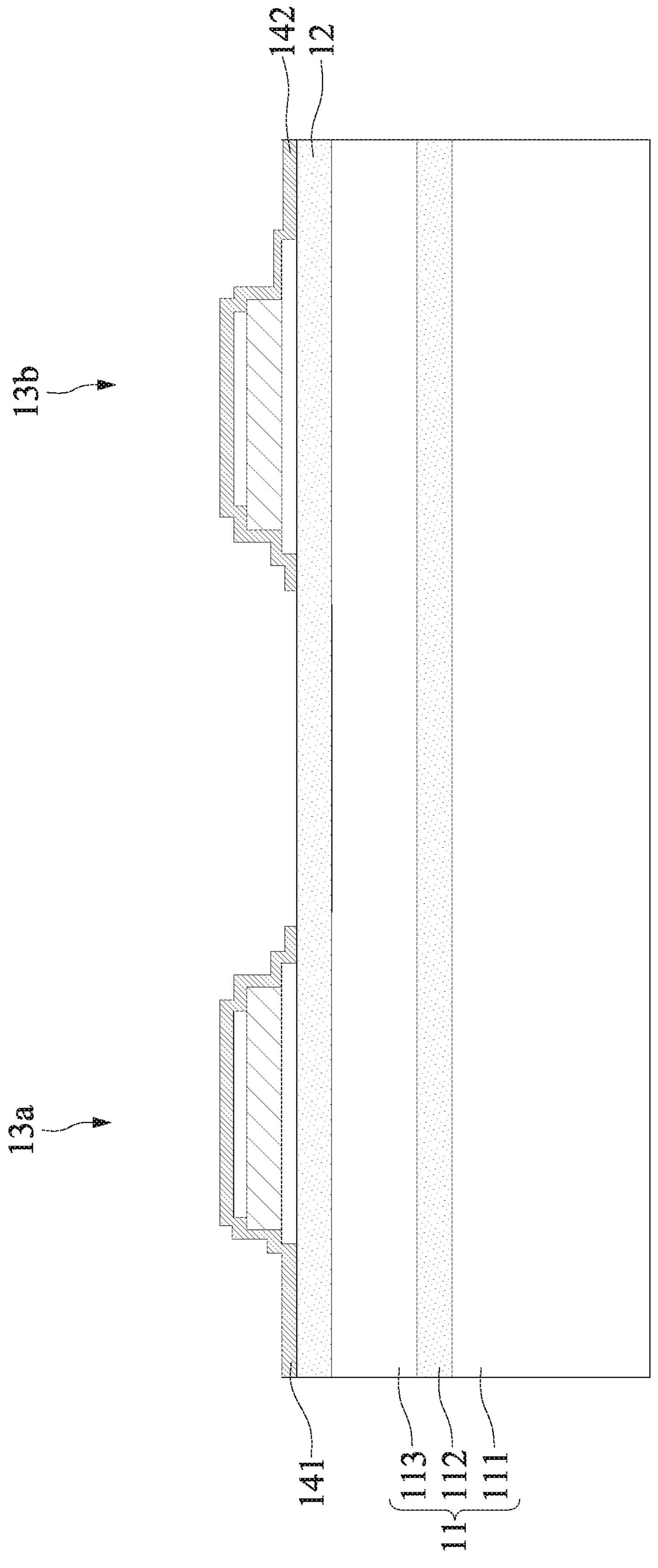

Referring to FIG. 5, after the formation of the high-k material layer 14, a patterning operation is performed to remove a portion of the high-k material layer 14. The portion of the high-k material layer 14 disposed vertically over a portion of the substrate 11, where a diaphragm is to be formed later, is removed for a purpose of simplifying subsequent processing. The high-k material layer 14 after the patterning operation includes a high-k layer 141 covering the piezoelectric capacitor 13*a* and a high-k layer 142 covering the piezoelectric capacitor 13*b*.

Figure 6:
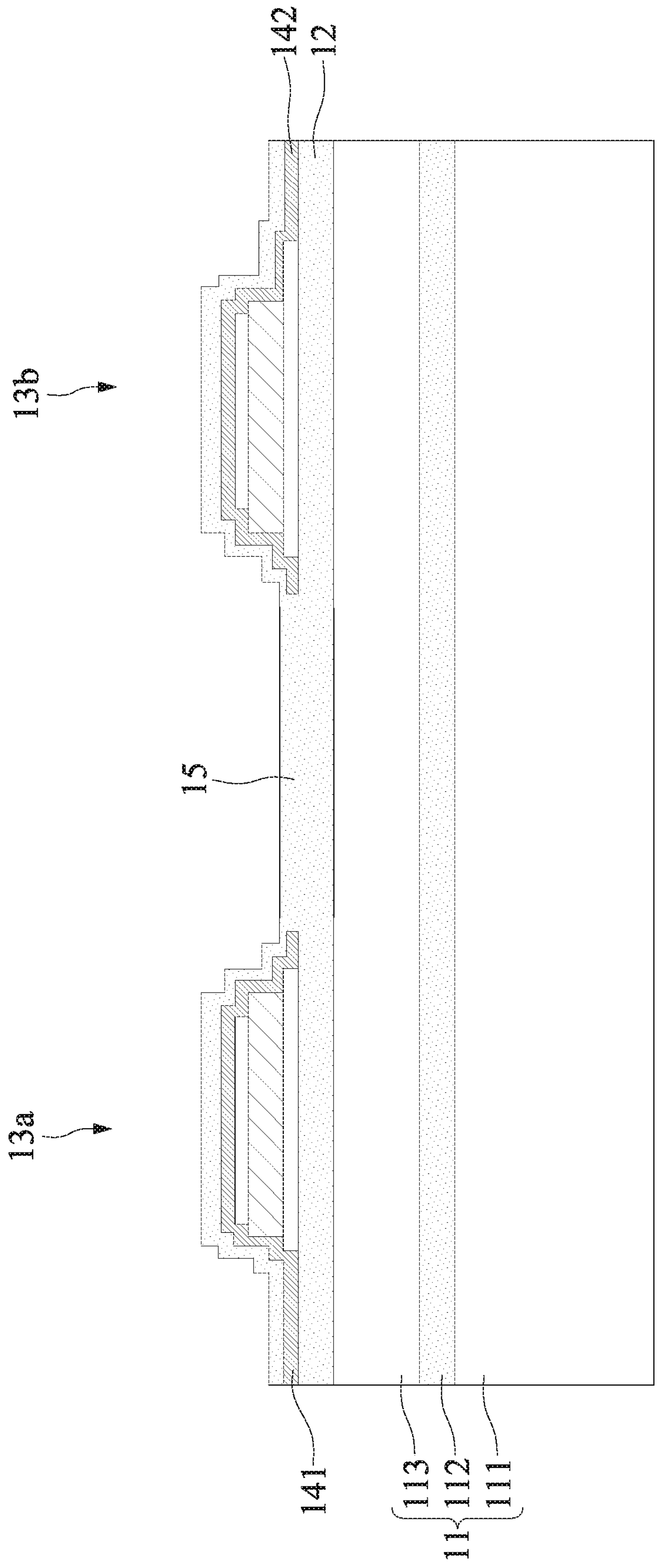

Referring to FIG. 6, after the patterning of the high-k material layer 14, a dielectric layer 15 is formed over the substrate 11 in a manner conformal to the piezoelectric capacitors 13*a* and 13*b*. In some embodiments, the dielectric layer 15 is formed by a conformal deposition, and a profile of the dielectric layer 15 is conformal to a profile of the high-k layers 141 and 142. The conformal deposition may include a chemical vapor deposition (CVD), a physical vapor deposition (PVD), an atomic layer deposition (ALD) or a combination thereof. In some embodiments, a thickness of the dielectric layer 15 is in a range of 1 kilo-angstrom (kA) to 10 kA. In some embodiments, a profile of the dielectric layer 15 is conformal to a profile of the piezoelectric capacitors 13*a* and 13*b*. In some embodiments, the dielectric layer 15 includes a material same as a material of the dielectric layer 12. In some embodiments, the dielectric layer 15 is an inter-metal dielectric layer.

Figure 7:
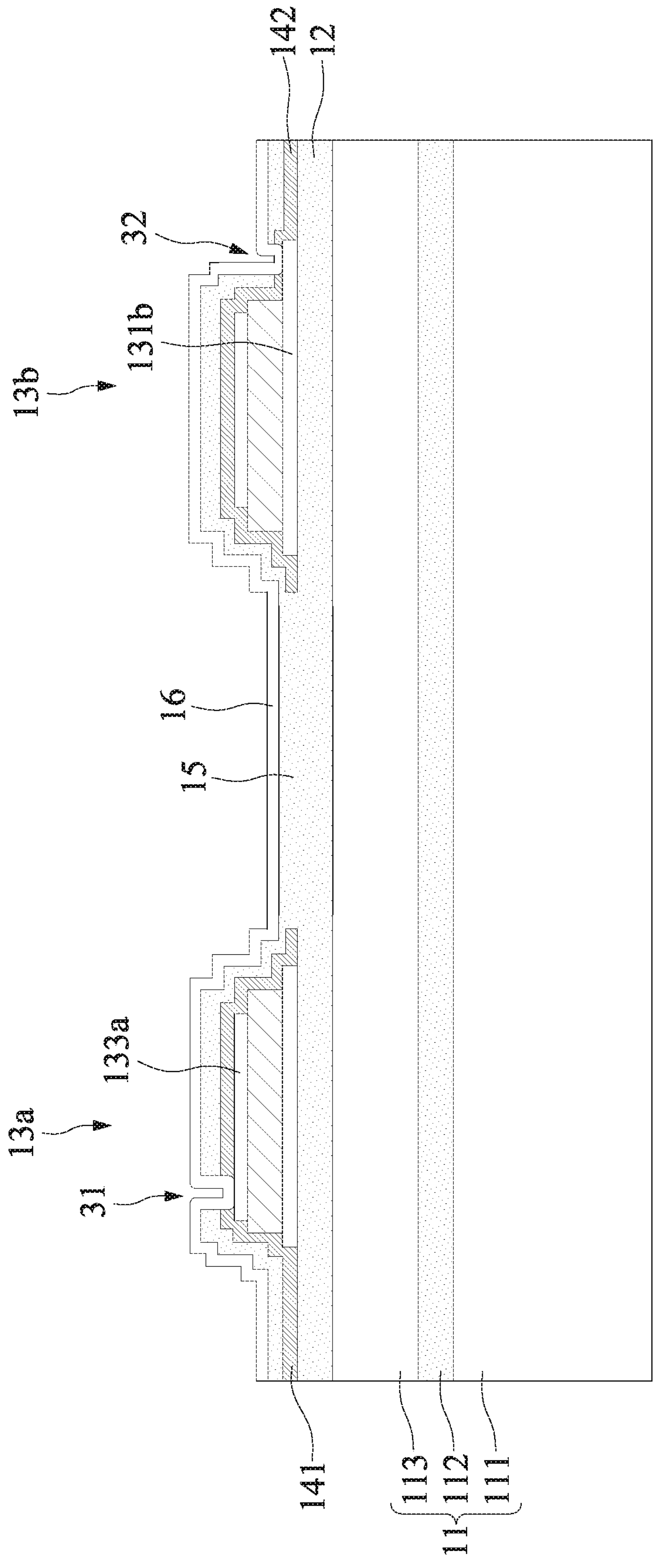

Referring to FIG. 7, a metallic surface of the piezoelectric capacitor 13*a* and a metallic surface of the piezoelectric capacitor 13*b* are exposed. The metallic surface of the piezoelectric capacitor 13*a* can be a surface of the top electrode 133*a* and/or a surface of the bottom electrode 131*a*. Similarly, the metallic surface of the piezoelectric capacitor 13*b* can be a surface of the top electrode 133*b* and/or a surface of the bottom electrode 131*b*. In some embodiments, the metallic surfaces of the piezoelectric capacitors 13*a* and 13*b* are exposed by a lift-off operation. In some embodiments, the metallic surfaces of the piezoelectric capacitors 13*a* and 13*b* are exposed by an ion beam etching, a reactive ion etching or a wet etching. In some embodiments, an opening 31 exposing the top electrode 131*a* and an opening 32 exposing the bottom electrode 133*b* are formed. Configurations of the openings 31 and 32 from a top view are not limited herein. A configuration of the opening 31 or the opening 32 can be circular, rectangular, triangular, oval, or other types of polygons. The configuration of the opening 31 and the opening 32 can be similar or different, and can be adjusted according to different applications. It should be noted that more than one opening 31 can be formed to expose the metallic surface of the piezoelectric capacitor 13*a*, and/or more than one opening 32 can be formed to expose the metallic surface of the piezoelectric capacitor 13*b*. However, only one opening 31 and one opening 32 are shown in the figures and description for a purpose of illustration only, and it is not intended to limit the present disclosure.

An intermediate layer 16 can be formed over the piezoelectric capacitors 13*a* and 13*b* in the openings 31 and 32. In some embodiments, the intermediate layer 16 is a metal-containing layer or a conductive layer for providing electrical connection. In some embodiments, the intermediate layer 16 serves as a diffusion barrier layer. In some embodiments, the intermediate layer 16 includes titanium (Ti), tungsten-titanium (TiW), titanium nitride (TiN), tantalum (Ta), tungsten (W), nickel (Ni), gold (Au), chromium (Cr), ruthenium (Ru), indium tin oxide (ITO), or a combination thereof. The intermediate layer 16 may be formed by a conformal deposition, an electron-beam physical vapor deposition (EBPVD), a sputtering operation, an electroplating operation, a screen printing operation, or other suitable method. The intermediate layer 16 may line the opening 31 and the opening 32. In some embodiments, the intermediate layer 16 is conformal to a profile of the opening 31 and a profile of the opening 32. The intermediate layer 16 may contact metallic surfaces of different piezoelectric capacitors at different elevations. In some embodiments, the intermediate layer 16 contacts the top electrode 133*a* of the piezoelectric capacitor 13A. In some embodiments, the intermediate layer 16 contacts the bottom electrode 131*b* of the piezoelectric capacitor 13B. In some embodiments, the intermediate layer 16 contacts the high-k layers 141 and 142. In some embodiments, the intermediate layer 16 contacts the dielectric layer 15 on the sidewalls of the openings 31 and 32. In some embodiments, a thickness of the intermediate layer 16 is in a range of 10 to 200 nanometers (nm).

Figure 8:
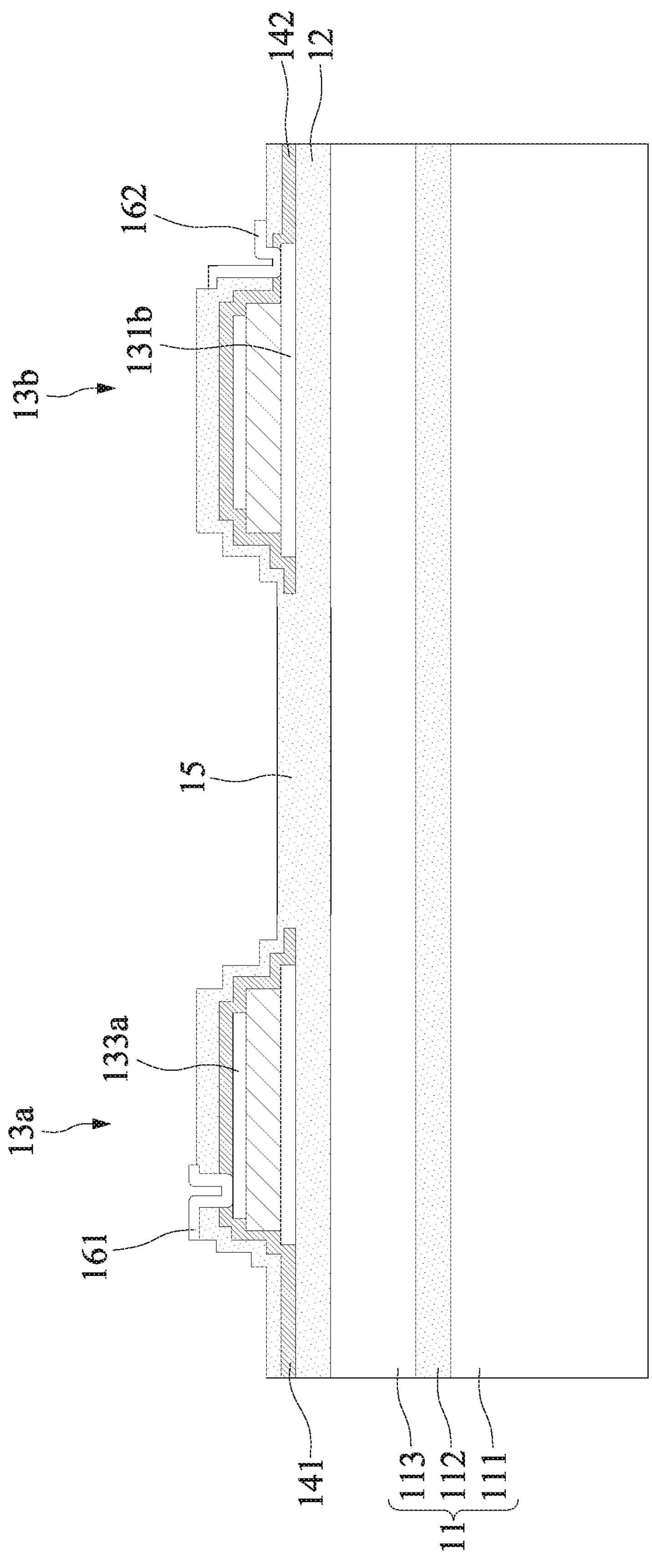

Referring to FIG. 8, the intermediate layer 16 is patterned, and an intermediate segment 161 and an intermediate segment 162 are thereby formed lining the openings 31 and 32 respectively. The patterning of the intermediate layer 16 may include a dry etching operation, a wet etching operation or a combination thereof. In some embodiments, a mask layer (not shown) is used during the patterning for a purpose of definition of the intermediate segment 161 and the intermediate segment 162.

Figure 9:
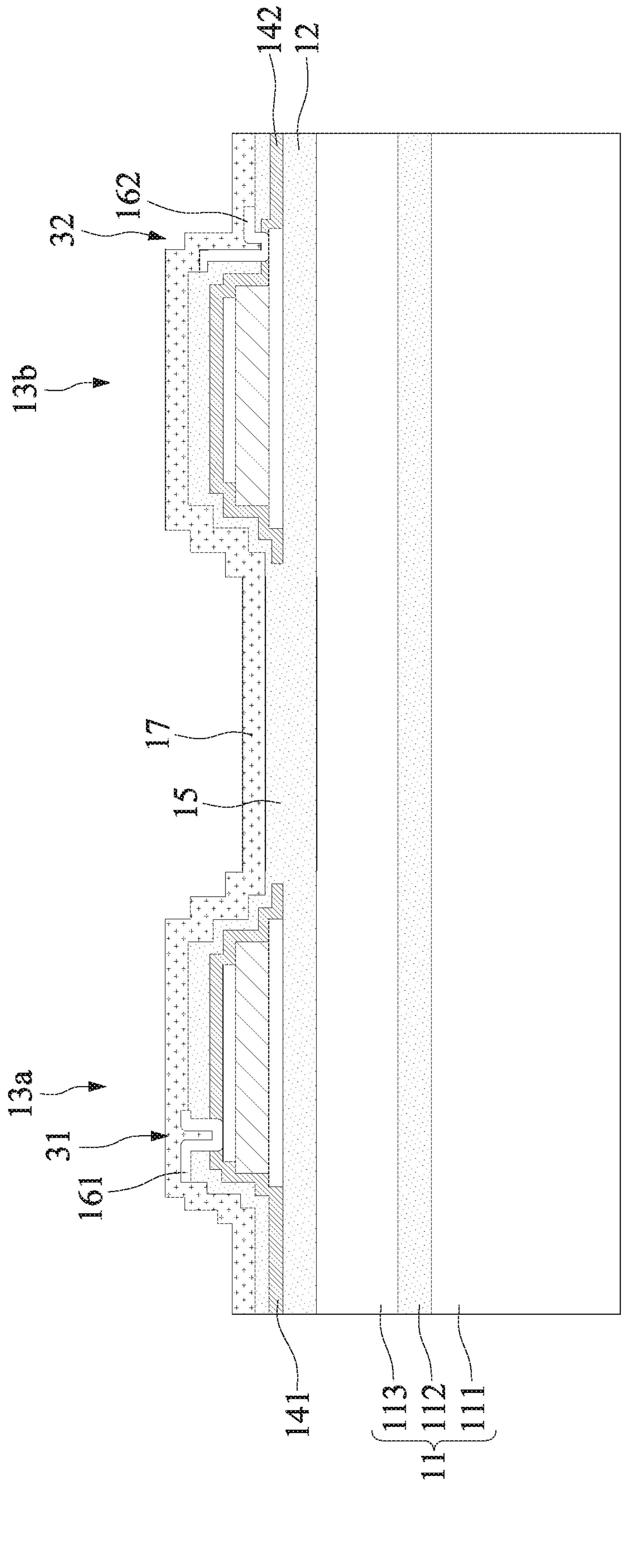

Referring to FIG. 9, a conductive layer 17 is formed over the substrate 11 and covers the intermediate segments 161 and 162. In some embodiments, the conductive layer 17 is conformal to a profile of the piezoelectric capacitors 13*a* and 13*b* and the substrate 11. In some embodiments, the conductive layer 17 fills the openings 31 and 32. In some embodiments, the conductive layer 17 includes one or more metals. In some embodiments, the conductive layer 17 includes aluminum (Al), copper (Cu), gold (Au), chromium (Cr) or a combination thereof. In some embodiments, the intermediate segments 161 and 162 are configured to prevent formation of the intermetallic compound between the conductive layer 17 and an electrode (e.g., 133*a* or 131*b*) of a piezoelectric capacitor (e.g., 13*a* or 13*b*). In some embodiments, the conductive layer 17 contacts the intermediate segments 161 and 162, especially in the openings 31 and 32. In some embodiments, the intermediate segments 161 and 162 separate the metallic surfaces of the piezoelectric capacitors 13*a* and 13*b* from the conductive layer 17. In some embodiments, the conductive layer 17 is formed by an electron-beam physical vapor deposition (EBPVD), a sputtering operation, an electroplating operation, a screen printing operation, or other suitable method. In some embodiments, a thickness of the conductive layer 17 is in a range of 100 nm to 10 μm.

Figure 10:
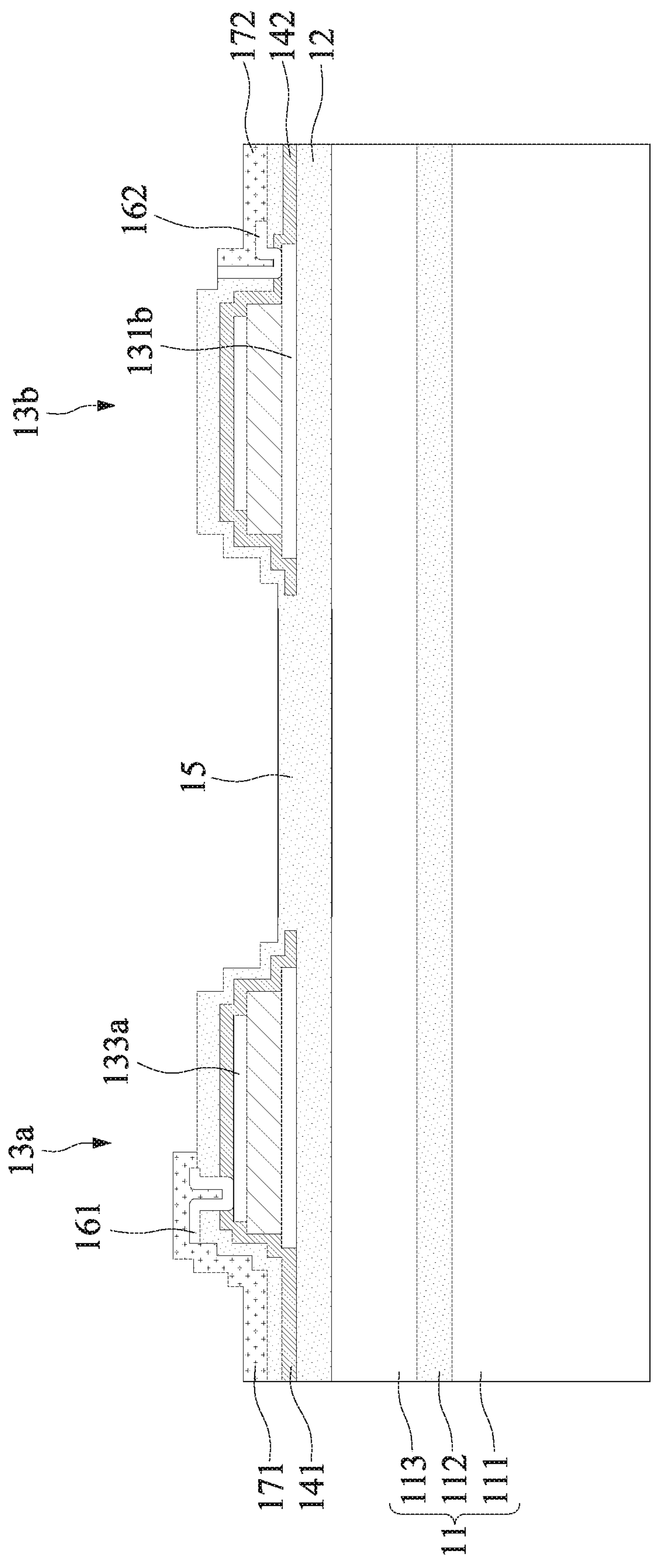

Please refer to FIG. 10, the conductive layer 17 is patterned, and conductive segments 171 and 172 are thereby formed. The patterning of the conductive layer 17 may include a dry etch, a wet etch or a combination thereof. Configurations of the conductive segments 171 and 172 can be defined by a mask layer or a hard layer (not shown) used as a mask in the patterning of the conductive layer 17. The conductive segments 171 and 172 can be smaller than, equal in size to, or larger than the intermediate segments 161 and 162, respectively, from a top-view perspective, depending on different applications.

Figure 11:
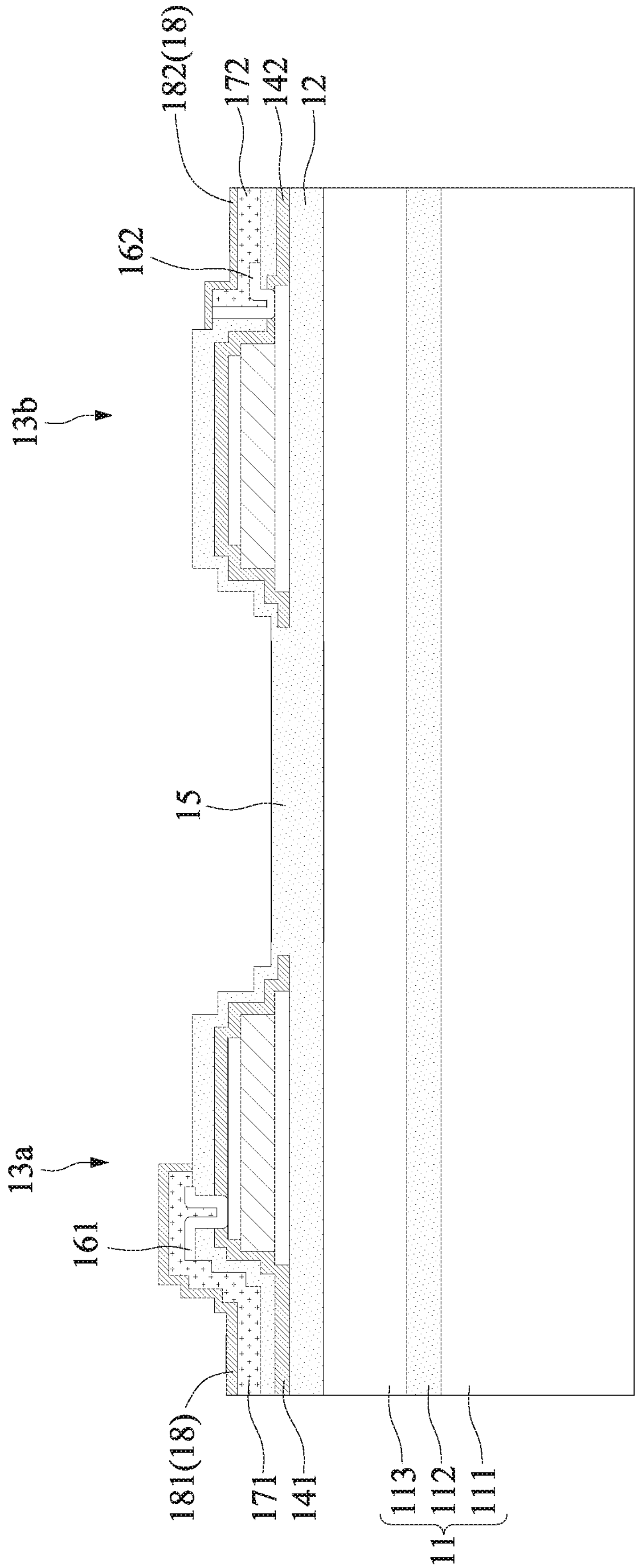

Referring to FIG. 11, a high-k material layer 18 is formed and patterned into a high-k layer 181 and a high-k layer 182. In some embodiments, the high-k material layer 18 is conformal to a profile of the conductive segments 171 and 172 and the dielectric layer 15. In some embodiments, the high-k layer 181 at least covers the conductive segment 171 and the high-k layer 182 at least covers the conductive segment 172. In some embodiments, the high-k layer 181 covers an entirety of the conductive segment 171 and the high-k layer 182 covers an entirety of the conductive segment 172. A material, formation and the patterning of the high-k material layer 18 can be similar to those of the high-k material layer 14, and the repeated description is omitted herein.

Figure 12:
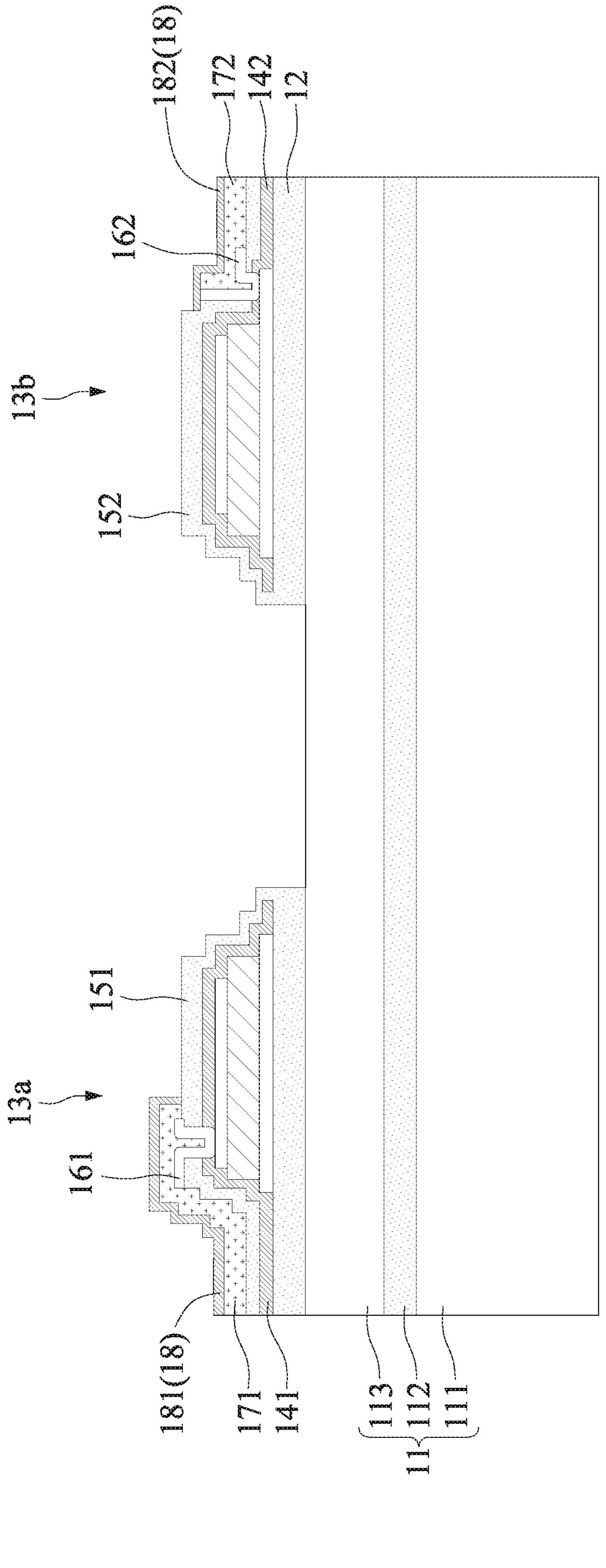

Referring to FIG. 12, a portion of the substrate 11 between the piezoelectric capacitors 13*a* and 13*b* is exposed. More specifically, a portion of the silicon layer 113 of the substrate 11, where the diaphragm of the semiconductor structure 10 is to be formed, is exposed. In some embodiments, a portion of the dielectric layer 12 and a portion of the dielectric layer 15 disposed between and exposed through the high-k layers 141 and 142 are removed. In some embodiments, the dielectric layer 12 and the dielectric layer 15 include a same dielectric material, and the portions of the dielectric layer 12 and the dielectric layer 15 are removed concurrently. In some embodiments, the exposure of the portion of the substrate 11 includes an ion beam etching, a reactive ion etching, a wet etching, a lift-off operation, or the like. In some embodiments, sidewalls of the high-k layers 141 and 142 proximal to the removed portion of the dielectric layer 12 are covered by remaining portions 151 and 152 of the dielectric layer 15. More specifically, the sidewall of the high-k layer 141 is covered by the portion 151 of the dielectric layer 15, and the sidewall of the high-k layer 142 is covered by the portion 152 of the dielectric layer 15.

Figure 13:
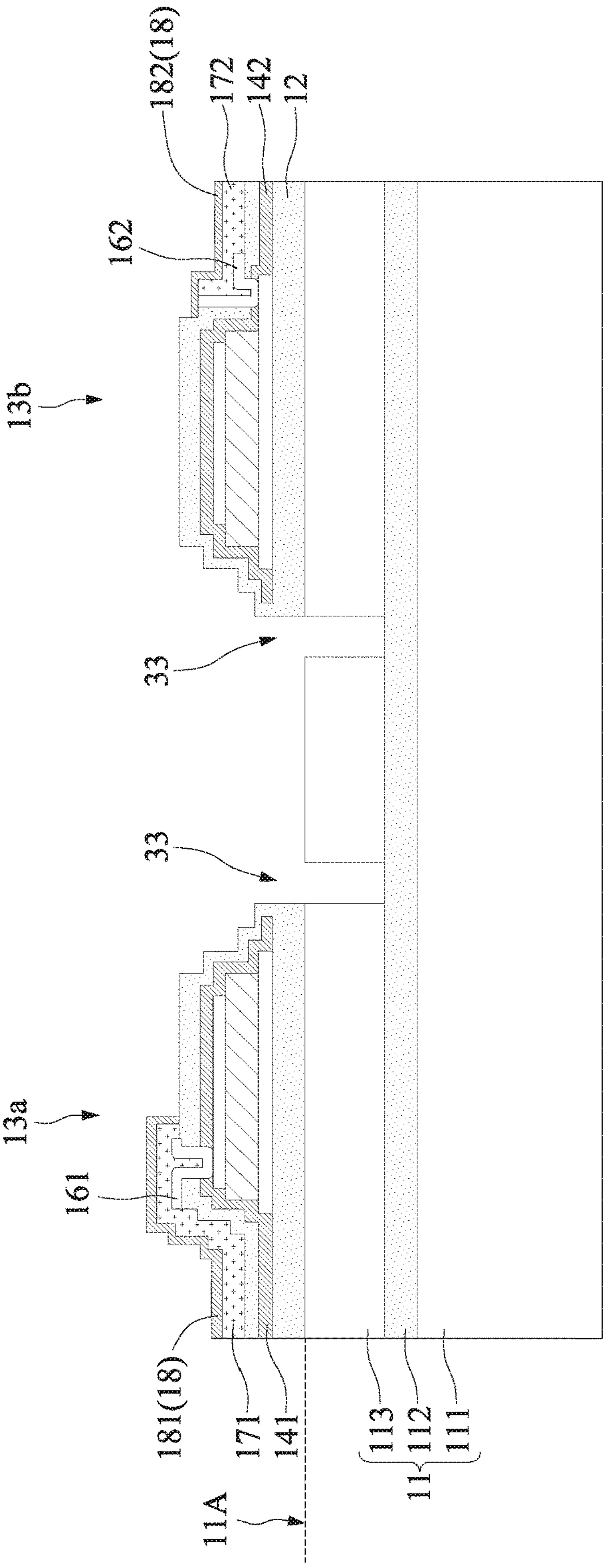
Figure 17:
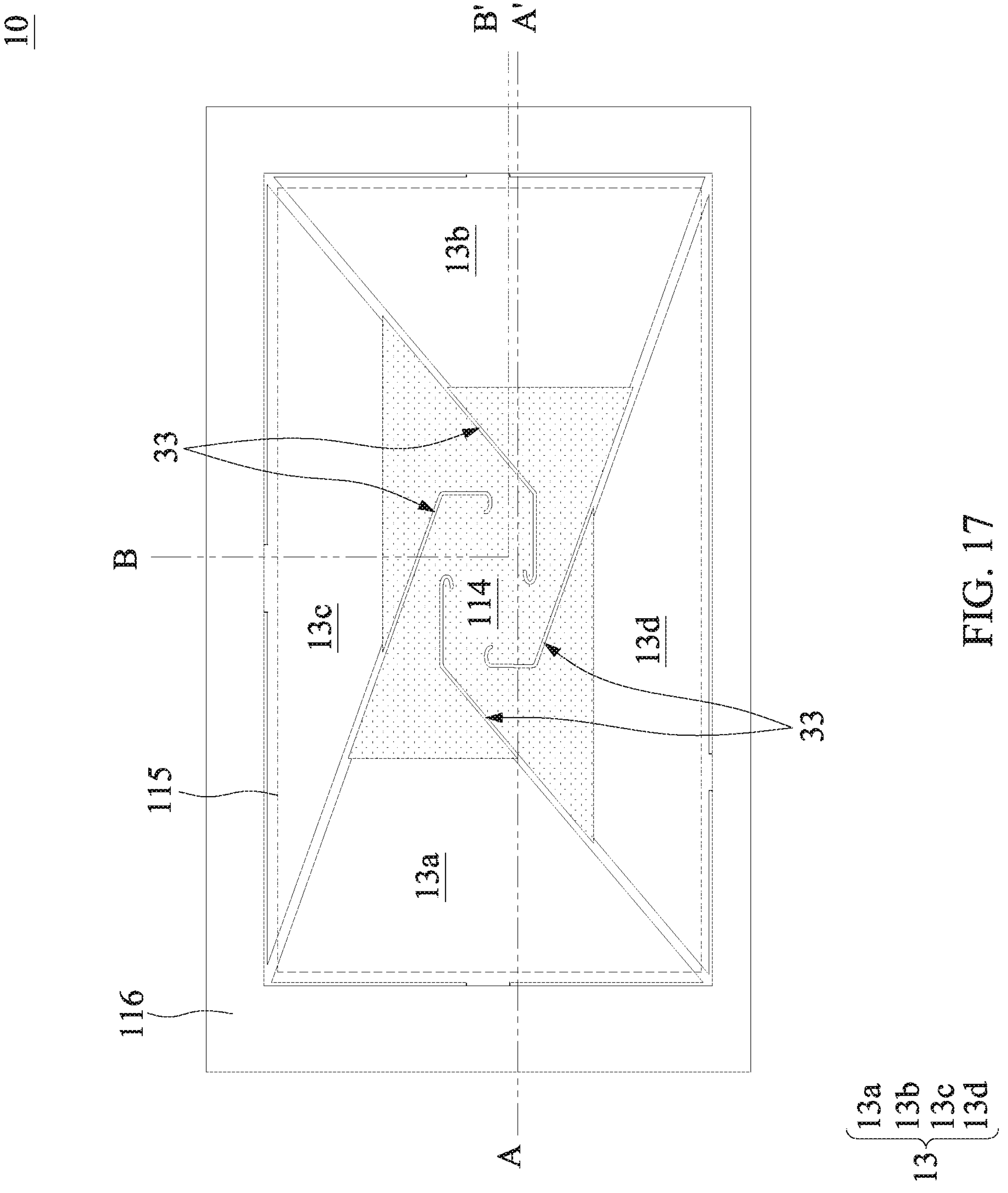
FIG. 17 is a schematic top view of a semiconductor structure of FIG. 16 in accordance with some embodiments of the disclosure.

Referring to FIG. 13, one or more openings 33 are formed in the substrate and indented from the first surface 11A. In some embodiments, the openings 33 penetrate the silicon layer 113. In some embodiments, a directional dry etch is performed to remove one or more portions of the exposed portion of the silicon layer 113. In some embodiments, one or more surficial portions of the insulator 112 exposed in the openings 33 are also removed. In some embodiments, the openings 33 are formed in a peripheral region of the exposed portion of the silicon layer 113. In some embodiments, at least one of the openings 33 extends toward a central region of the exposed portion of the silicon layer 113 (as shown in FIG. 17 and detailed illustration is provided in following paragraphs).

Figure 14:
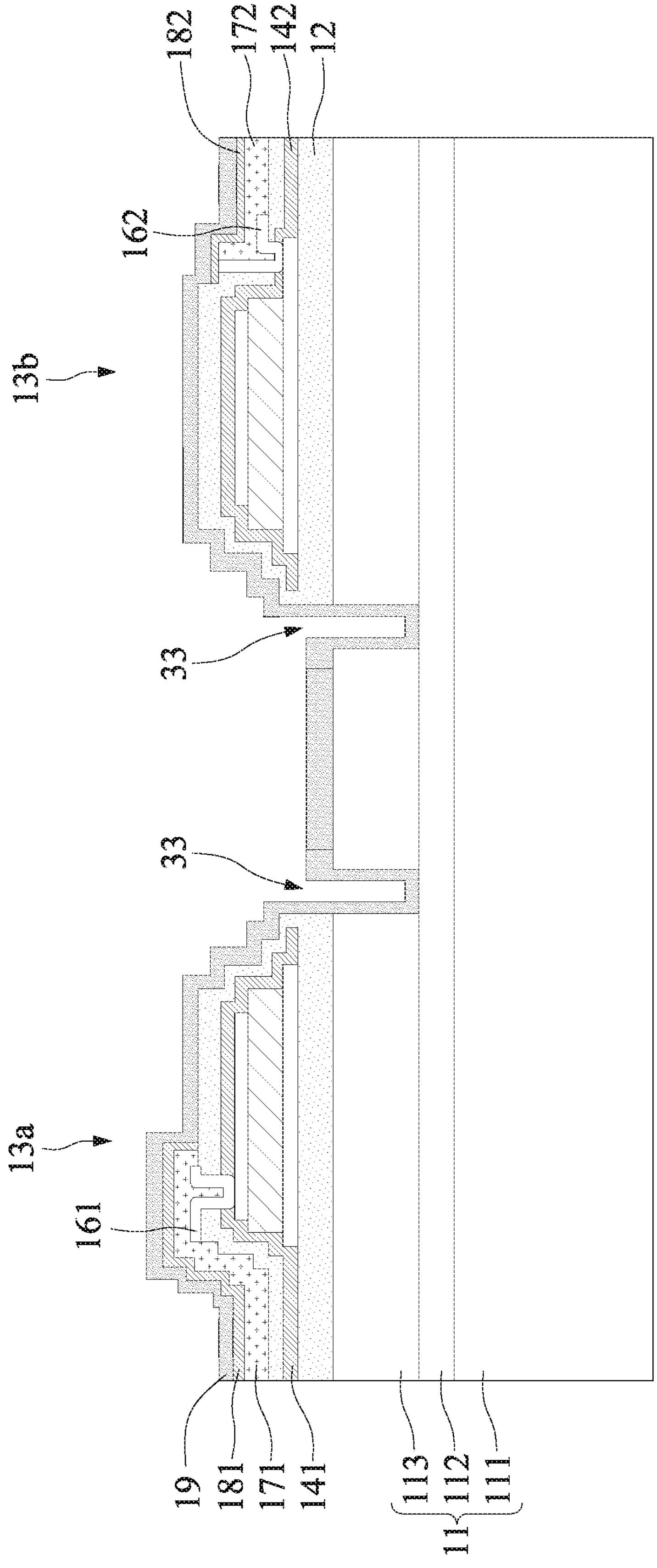

Referring to FIG. 14, a dielectric layer 19 is formed over and conformal to the piezoelectric capacitors 13*a* and 13*b* and the substrate 11. In some embodiments, a deposition is performed to form the dielectric layer 19. The dielectric layer 19 may be function as a passivation layer, a stress layer, or a combination thereof. In some embodiments, the dielectric layer 19 includes silicon nitride, silicon oxide, silicon oxynitride, other suitable dielectric materials, or a combination thereof. In some embodiments, the dielectric layer 19 lines sidewalls and bottom surfaces of the openings 33. In some embodiments, the dielectric layer 19 contacts the silicon layer 113 and the insulator 112.

Figure 15:
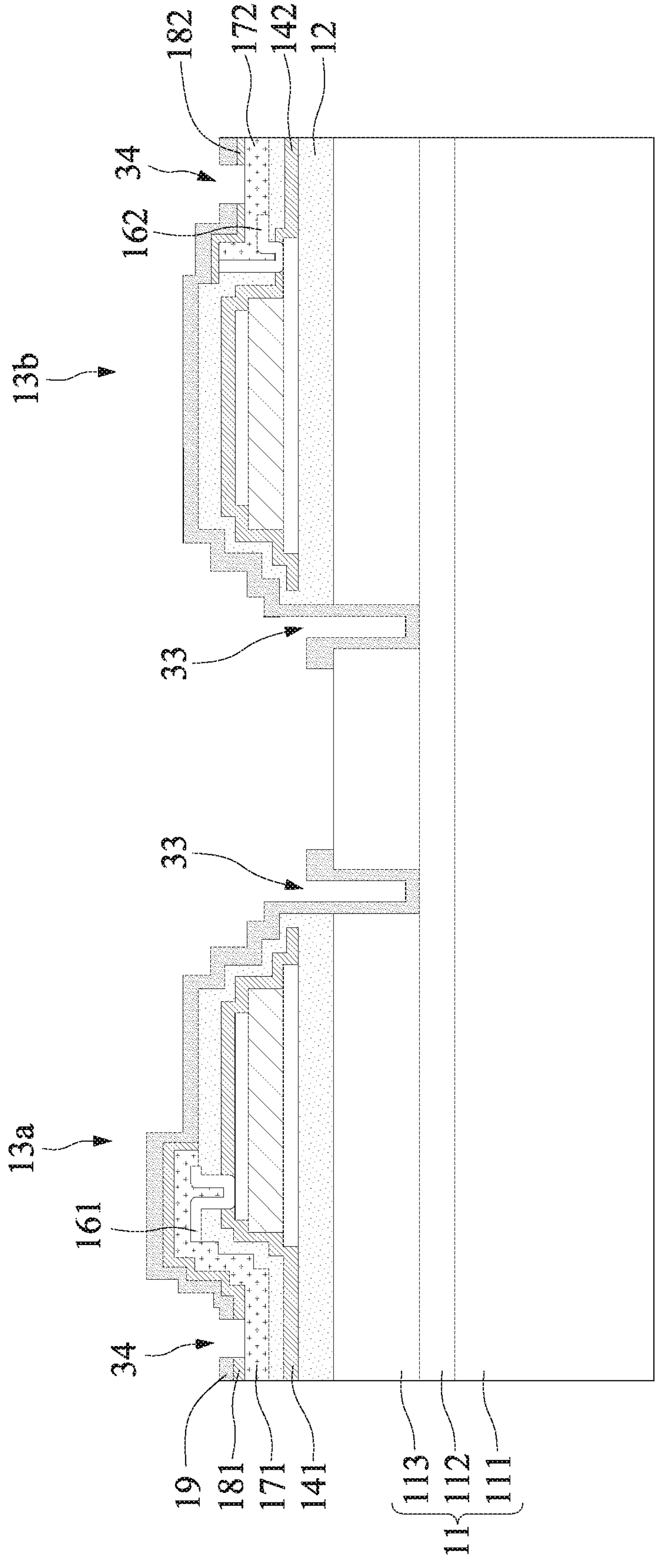

Referring to FIG. 15, portions of the conductive segments 171 and 172 are exposed through openings 34. In some embodiments, portions of the high-k layers 181 and 182 and portions of the dielectric layer 19 are removed, thereby forming the openings 34. In some embodiments, the exposure of the portions of the conductive segments 171 and 172 includes an ion beam etching, a reactive ion etching, a wet etching, a lift-off operation, or the like. In some embodiments, a portion of the dielectric layer 19 between the piezoelectric capacitors 13*a* and 13*b* is further removed concurrently with the formation of the openings 34, and a portion of silicon layer 113 is exposed through the dielectric layer 19 at where the diaphragm is to be formed later. In some embodiments, the portions of the high-k layers 181 and 182 are removed after the removal of the portions of the dielectric layer 19 by a separate etching operation. In some embodiments, the portions of the high-k layers 181 and 182 and the portions of the dielectric layer 19 are removed concurrently by the same etching operation. The exposure of the portions of the conductive segments 171 and 172 is for a purpose of electrical connection to other electrical components for transmitting current or voltage. The electrical connection can be achieved by conventional methods according to different applications, and the detailed illustration is omitted herein.

Figure 16:
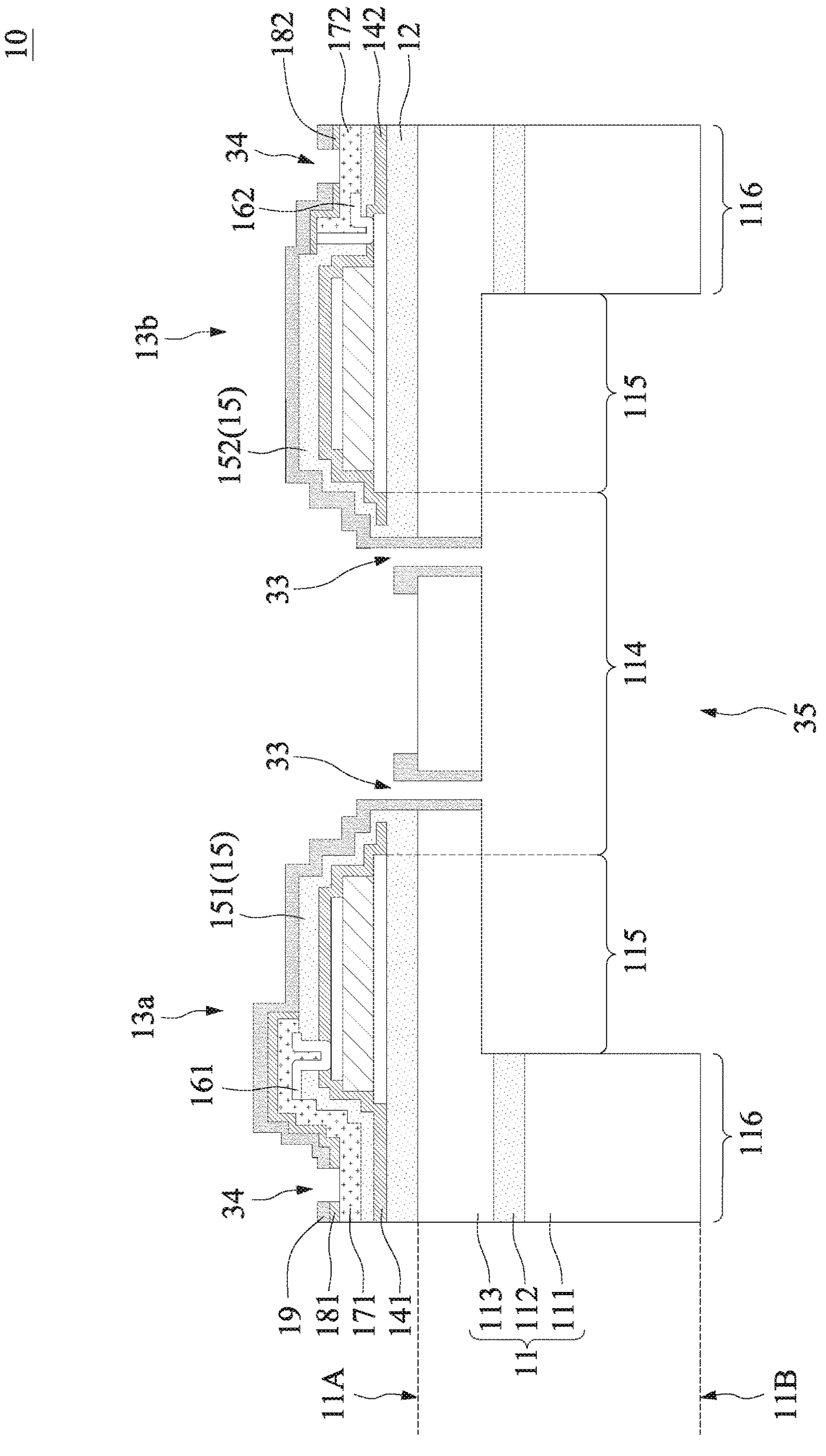

Referring to FIG. 16, a cavity 35 is formed in the substrate 11 and indented from a second surface 11B of the substrate 11, wherein the second surface 11B is opposite to the first surface 11A. In some embodiments, the formation of the cavity 35 includes removal of a portion of the bulk substrate 111 and a portion of the insulator 112. In some embodiments, the removal of the portion of the bulk substrate 111 and the portion of the insulator 112 includes an ion beam etching, a reactive ion etching, a wet etching, or a combination thereof. The cavity 35 may vertically overlap an entirety of the exposed portion of the silicon layer 113. In some embodiments, the cavity 35 overlaps at least part of the piezoelectric capacitor 13*a* along a vertical direction. In some embodiments, the cavity 35 overlaps at least part of the piezoelectric capacitor 13*b* along the vertical direction. In some embodiments, formation of the cavity 35 includes removal of a portion of the dielectric layer 19 lining the silicon layer 113 at bottoms of the openings 33. As a result, the cavity 35 may be connected to or in fluid communication with the openings 33 for a purpose of air to flow through. A diaphragm portion 114, a cantilever portion 115 and an anchor portion 116 of the substrate 11 are thereby formed. In some embodiments, the diaphragm portion 114 is defined at a central region of the cavity 35 and between the piezoelectric capacitors 13*a* and 13*b*. In some embodiments, the cantilever portion 115 is defined at a peripheral region surrounding the central region of the cavity. In some embodiments, the cantilever portion 115 surrounds the diaphragm portion 114. In some embodiments, the anchor portion 116 surrounds defines sidewalls of the cavity 35. In some embodiments, the anchor portion 116 surrounds the cantilever portion 115 and the diaphragm portion 114.

The piezoelectric capacitors 13*a* and 13*b* are disposed over the cantilever portion 115. The piezoelectric capacitors 13*a* and 13*b* may or may not cover the anchor portion 116. In some embodiments, a portion of the piezoelectric capacitor 13*a* is over the anchor portion 116. In some embodiments, a portion of the piezoelectric capacitor 13*b* is over the anchor portion 116. A majority of the piezoelectric capacitor 13*a* (and/or 13*b*) is over the cantilever portion 115 even a portion thereof covers the anchor portion 116. In some embodiments, an entirety of the piezoelectric capacitor 13*a* (and/or 13*b*) is over the cantilever portion 115.

It should be noted that the diaphragm portion 114 represents a vibration portion of a MEMS speaker. In some embodiments, the portions 114 and 115 are collectively referred to as a membrane. In addition, the exposure of the conductive segments 171 and 172 and/or formation of the electrical connections to the piezoelectric capacitors 13*a* and 13*b* can be performed after formation of the cavity 35 as long as a semiconductor structure 10 shown in FIG. 16 can be achieved, and are not limited herein. A semiconductor structure 10 is thereby formed. In some embodiments, the semiconductor structure 10 is an audio unit or a speaker unit formed on a wafer (or substrate 11).

FIG. 17 is a schematic top view of the semiconductor structure 10 as shown in FIG. 16. The piezoelectric capacitors 13 may represent a capacitor structure. In some embodiments, the piezoelectric capacitors 13 includes four portions (segments, or capacitors) 13*a*, 13*b*, 13*c* and 13*d*. It is noted that the last digitals -a, -b, -c, and -d are for a purpose of indication of different portions/segments/capacitors of the piezoelectric capacitors 13 only, and the four capacitors 13*a*, 13*b*, 13*c* and 13*d* can have similar or same structure. In some embodiments, the semiconductor structure 10 shown in FIG. 16 is a cross section along a line A-A' shown in FIG. 17. In some embodiments, the semiconductor structure 10 shown in FIG. 16 is a cross section along a line B-B' shown in FIG. 17. The openings 33 are for a purpose of pressure release during vibration, and an arrangement or a pattern of the openings 33 from the top view shown in FIG. 17 is an exemplary embodiment for a purpose of illustration but is not limited thereto. In some embodiments, the piezoelectric capacitors 13*a*, 13*b*, 13*c* and 13*d* are physically isolated from one another. In some embodiments, top electrodes of different piezoelectric capacitors 13*a*, 13*b*, 13*c* and 13*d* are electrically connected to a same bias or voltage. In some embodiments, bottom electrodes of different piezoelectric capacitors 13*a*, 13*b*, 13*c* and 13*d* are electrically connected to a same bias or voltage.

Referring back to FIG. 17, the dielectric layers 12, 14, 15 and 19 can be collectively referred to a stress structure. A stress from the stress structure in over a region of the substrate 11 is adjusted according to a comprehensive result of voltage dependency of d31/d33 of the piezoelectric layer 132 and geometric effect.

In some embodiments, the stress of the stress structure is controlled by adjusting a thickness of one or more of the dielectric layers 12, 14, 15 and 19.

Figure 18:
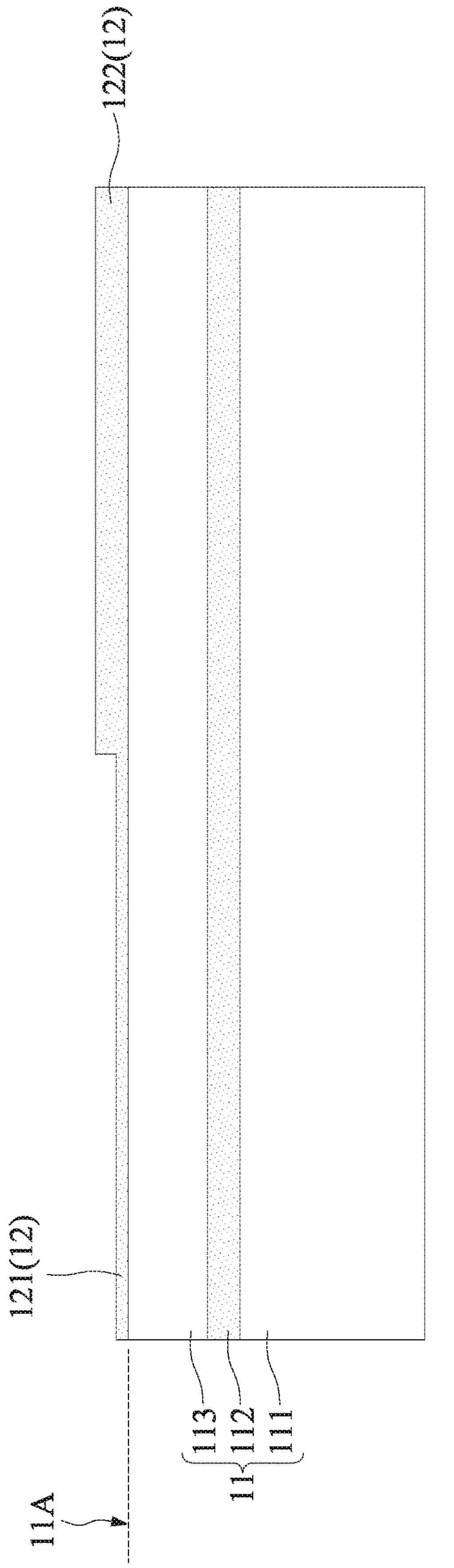
FIGS. 18 to 19 are schematic diagrams at different stages of a method for manufacturing a semiconductor structure in accordance with different embodiments of the disclosure.

Referring to FIG. 18, a thickness of a portion 121 or 122 of the dielectric layer 12 is adjusted or changed after the formation of the dielectric layer 12 as depicted in FIG. 1. In some embodiments, the portion 121 of the dielectric layer 12 is to be overlapped by a piezoelectric capacitor 13*a* to be formed in subsequent processing, and the thickness of the portion of the dielectric layer 12 is reduced. In some embodiments, the reduction of the thickness is achieved by an etching operation. In some embodiments, the reduction of the thickness of the portion 121 of the dielectric layer 12 results in an upward adjustment of a starting position of a diaphragm or a membrane. In some embodiments, the thickness of the portion 121 of the dielectric layer 12 after the reduction is in a range of 0.8 to 1.2 μm. In some embodiments, the portion 122 of the dielectric layer 12 is to be overlapped by a piezoelectric capacitor 13*b* to be formed in subsequent processing, and the thickness of the portion 122 of the dielectric layer 12 is increased. In some embodiments, the increment of the thickness of the portion 122 of the dielectric layer 12 is achieved by performing another deposition only in a corresponding area. In some embodiments, the increment of the thickness of the portion 122 of the dielectric layer 12 results in a downward adjustment of the starting position of the diaphragm/membrane. In some embodiments, the thickness of the portion 122 of the dielectric layer 12 after the increment is in a range of 1.0 to 2.5 μm.

Figure 19:
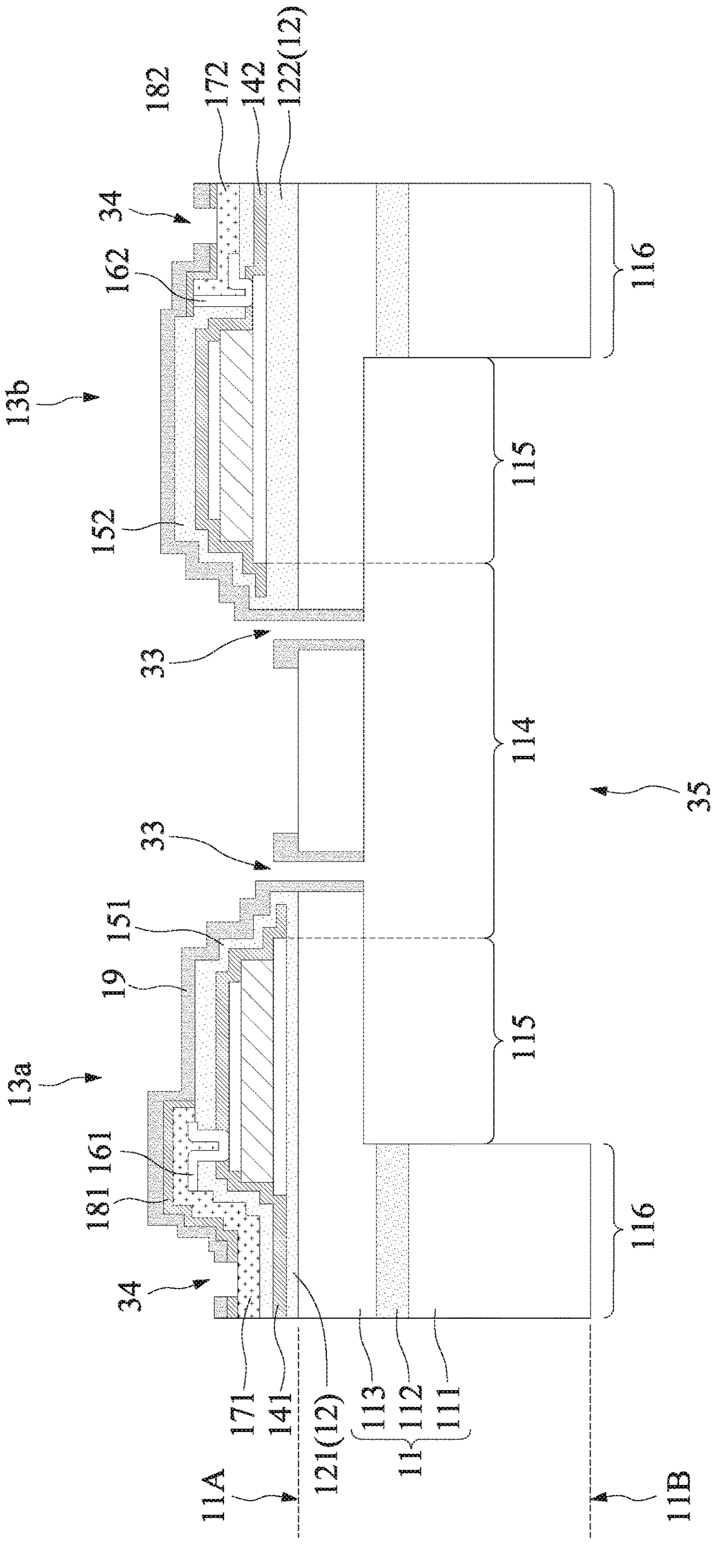

Referring to FIG. 19, operations as depicted in FIGS. 2 to 16 are performed on the intermediate structure shown in FIG. 18, and a semiconductor structure 11 is thereby formed. In some embodiments, thicknesses of different portions of the dielectric layer 12 disposed on different sides of a diaphragm portion 114 are substantially different. In some embodiments, a piezoelectric capacitor 13*a* is at an elevation lower than that of a piezoelectric capacitor 13*b* due to a smaller thickness of the dielectric layer 12 under the piezoelectric capacitor 13*a* compared to the thickness of the dielectric layer 12 under the piezoelectric capacitor 13*b*.

It should be noted that, similar operations as depicted in FIG. 18 can be applied on the dielectric layer 15 after the operations as depicted in FIG. 6. Repeated description is omitted herein.

Figure 20:
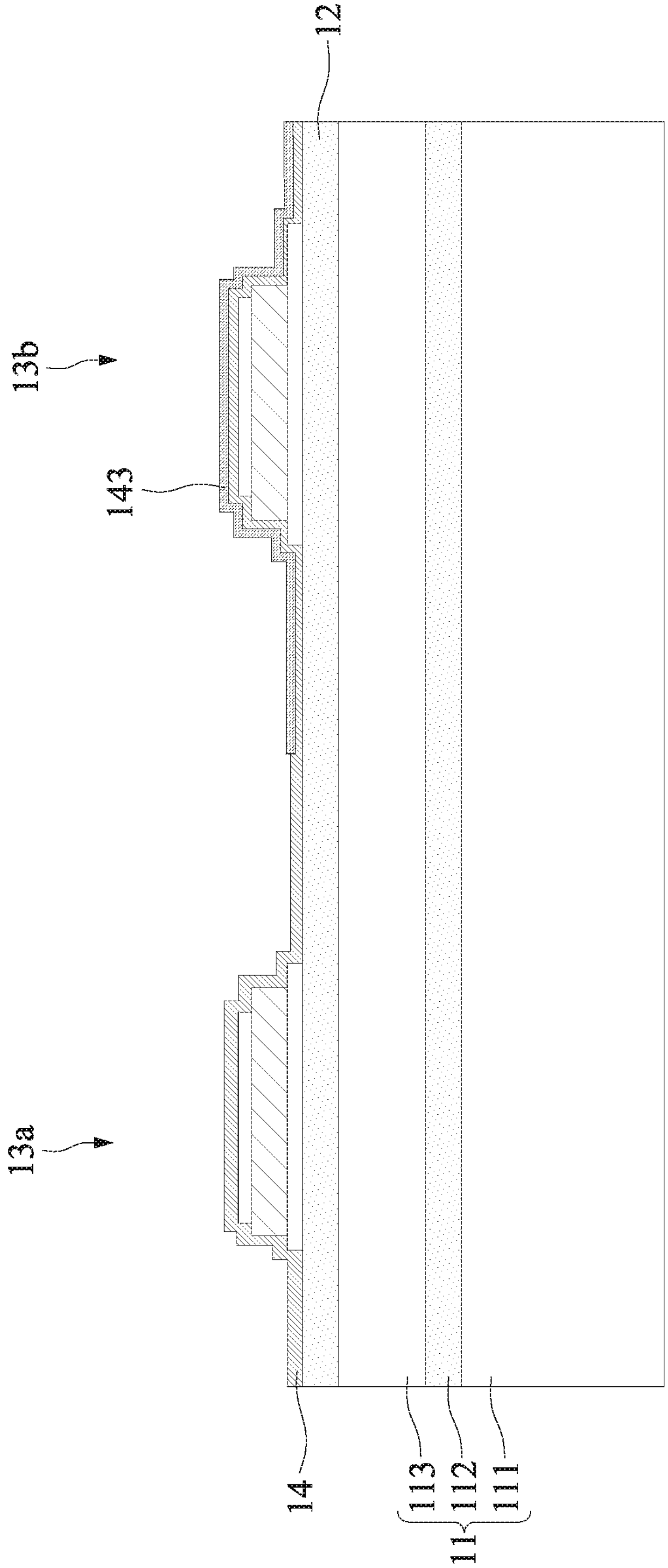
FIGS. 20 to 21 are schematic diagrams at different stages of a method for manufacturing a semiconductor structure in accordance with different embodiments of the disclosure.

Referring to FIG. 20, a thickness of a portion of a high-k material layer 14 is adjusted or changed after the operations as depicted in FIG. 4. In some embodiments, the portion of the high-k material layer 14 is to overlap or cover a piezoelectric capacitor 13*b* to be formed in subsequent processing, and the thickness of the portion of the high-k material layer 14 is increased. In some embodiments, the increment of the thickness of the portion of the high-k material layer 14 is achieved by performing an additional deposition only in a corresponding area. In some embodiments, a sub-layer 143 of the high-k material layer 14 is formed conformal to the piezoelectric capacitor 13*b* by the additional deposition. In some embodiment, the sub-layer 143 includes a high-k dielectric material. The high-k dielectric material can be the same as or different from the high-k material layer 14 as depicted in FIG. 4 depending on stress requirements of different applications. In some embodiments, the sub-layer 143 includes a low-k dielectric material. In some embodiments, the sub-layer 143 includes silicon nitride. In some embodiments, the addition of the sub-layer 143 results in a downward adjustment of a starting position of a diaphragm/membrane.

Figure 21:
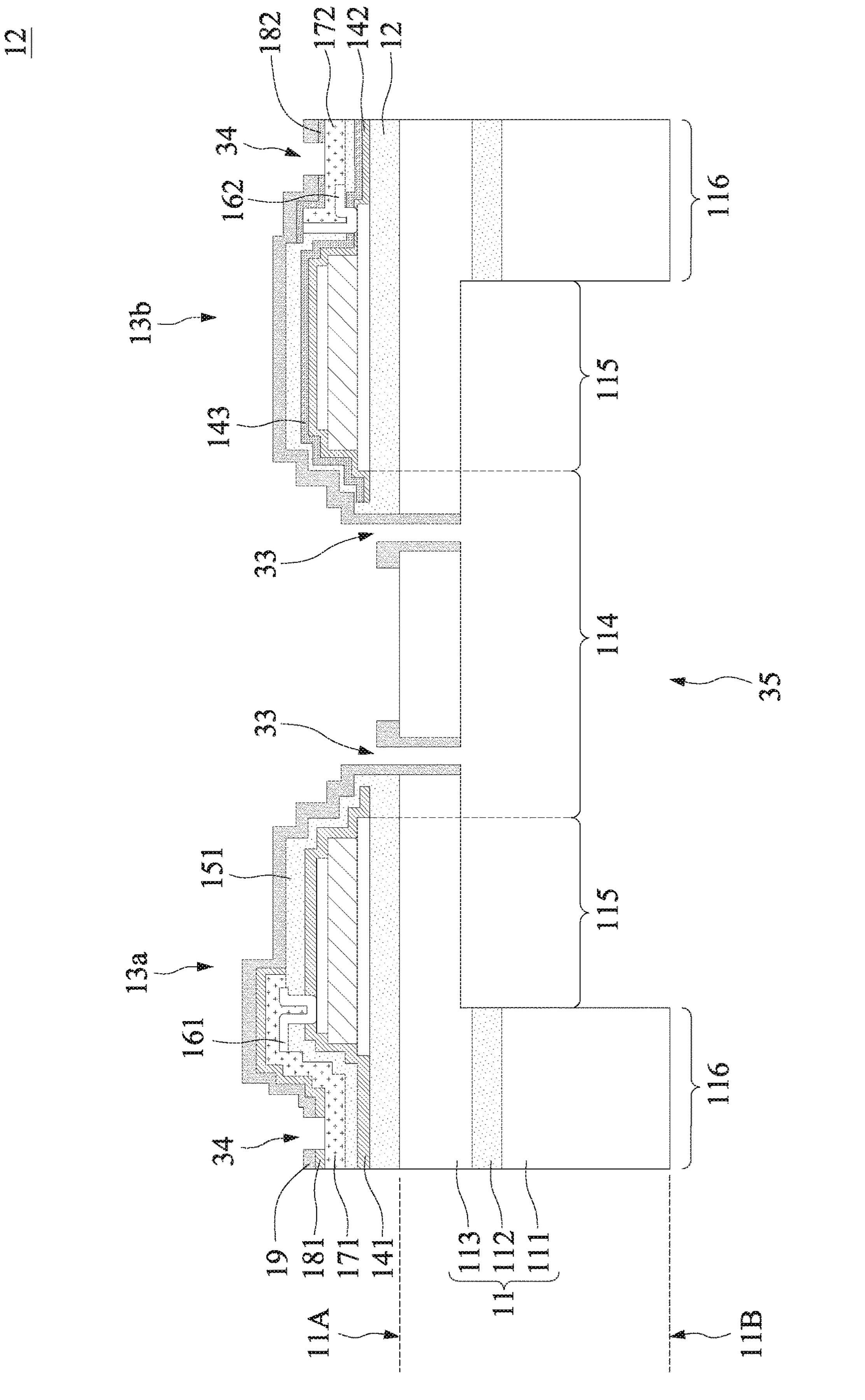

Referring to FIG. 21, operations as depicted in FIGS. 5 to 16 are performed on the intermediate structure shown in FIG. 20, and a semiconductor structure 12 is thereby formed. In some embodiments, thicknesses of different portions of the high-k material layer 14 disposed on different sides of a diaphragm portion 114 are substantially different. In some embodiments, a total thickness of high-k layers 142 and 143 over a piezoelectric capacitor 13*b* is substantially greater than a thickness of high-k layer 141 over a piezoelectric capacitor 13*a*.

In some embodiments, the stress of the stress structure is controlled by adjusting a coverage area of one or more of the dielectric layers 12, 14, 15 and 19.

Figure 22:
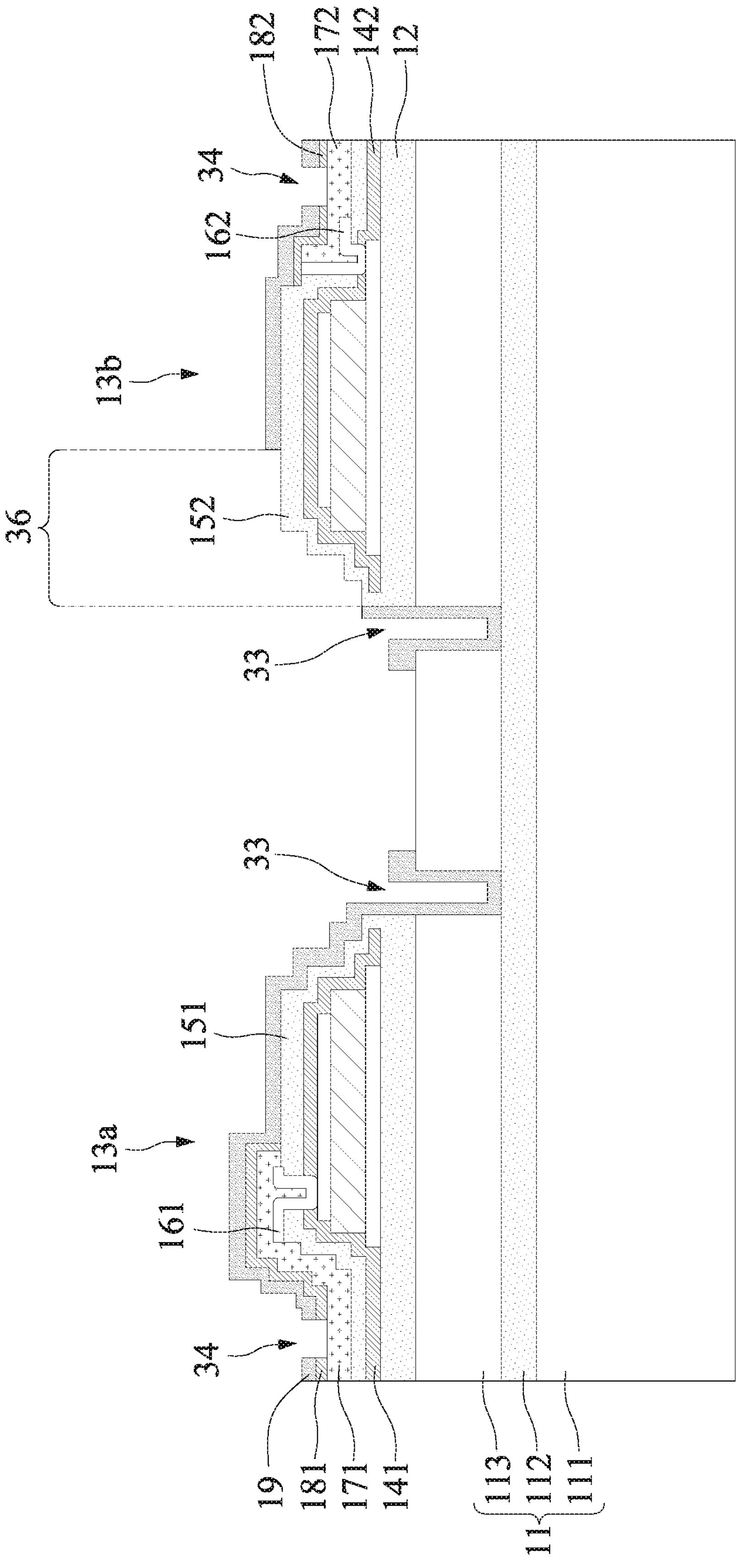
FIGS. 22 to 23 are schematic diagrams at different stages of a method for manufacturing a semiconductor structure in accordance with different embodiments of the disclosure.

Referring to FIG. 22, a portion of the dielectric layer 19 is removed after the formation of the dielectric layer 19 as depicted in FIG. 14. In some embodiments, the portion of the dielectric layer 19 is removed to partially expose the portion 152 of the dielectric layer 15. In some embodiments, the portion of the dielectric layer 19 being removed is proximal to a diaphragm portion 114 to be formed in subsequent processing. In some embodiments, an opening 36 is formed by the removal of the portion of the dielectric layer 19. In some embodiments, the removal of the portion of the dielectric layer 19 is performed concurrently with the operations as depicted in FIG. 15.

Figure 23:
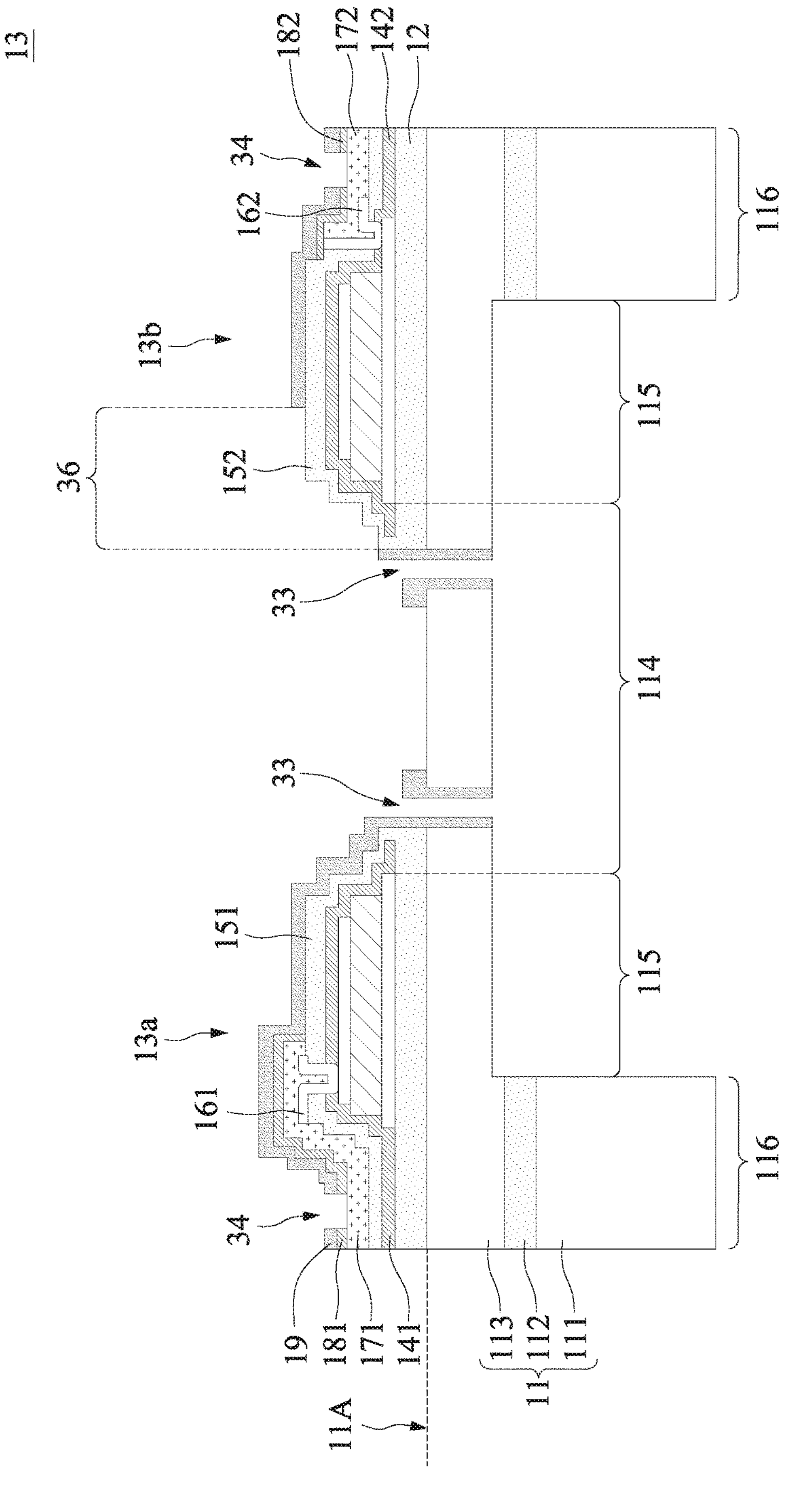
Figure 24:
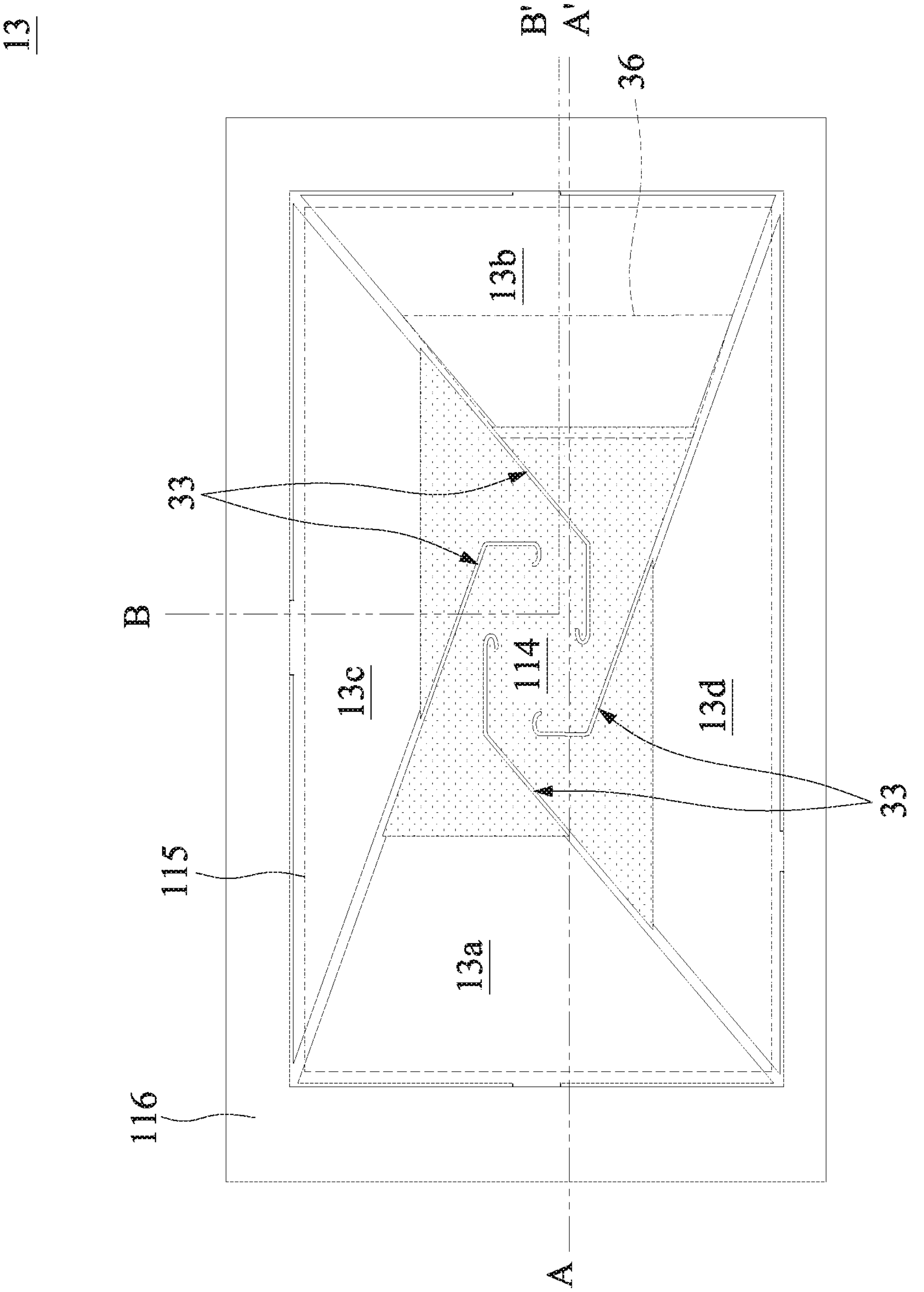
FIG. 24 is a schematic top view of a semiconductor structure of FIG. 23 in accordance with some embodiments of the disclosure.

Referring to FIGS. 23 and 24, operations as depicted in FIG. 16 are performed on the intermediate structure shown in FIG. 22, and a semiconductor structure 13 is thereby formed. FIG. 23 shows a schematic cross section of the semiconductor structure 13 along a line A-A' or B-B', and FIG. 24 shows a schematic top view of the semiconductor structure 13. In some embodiments, a coverage area of the dielectric layer 19 over a piezoelectric capacitor 13*b* is less than a coverage area of the dielectric layer 19 over a piezoelectric capacitor 13*a*.

In some embodiments, the stress of the stress structure is controlled by an additional treatment on one or more of the dielectric layers 12, 14, 15 and 19.

Figure 25:
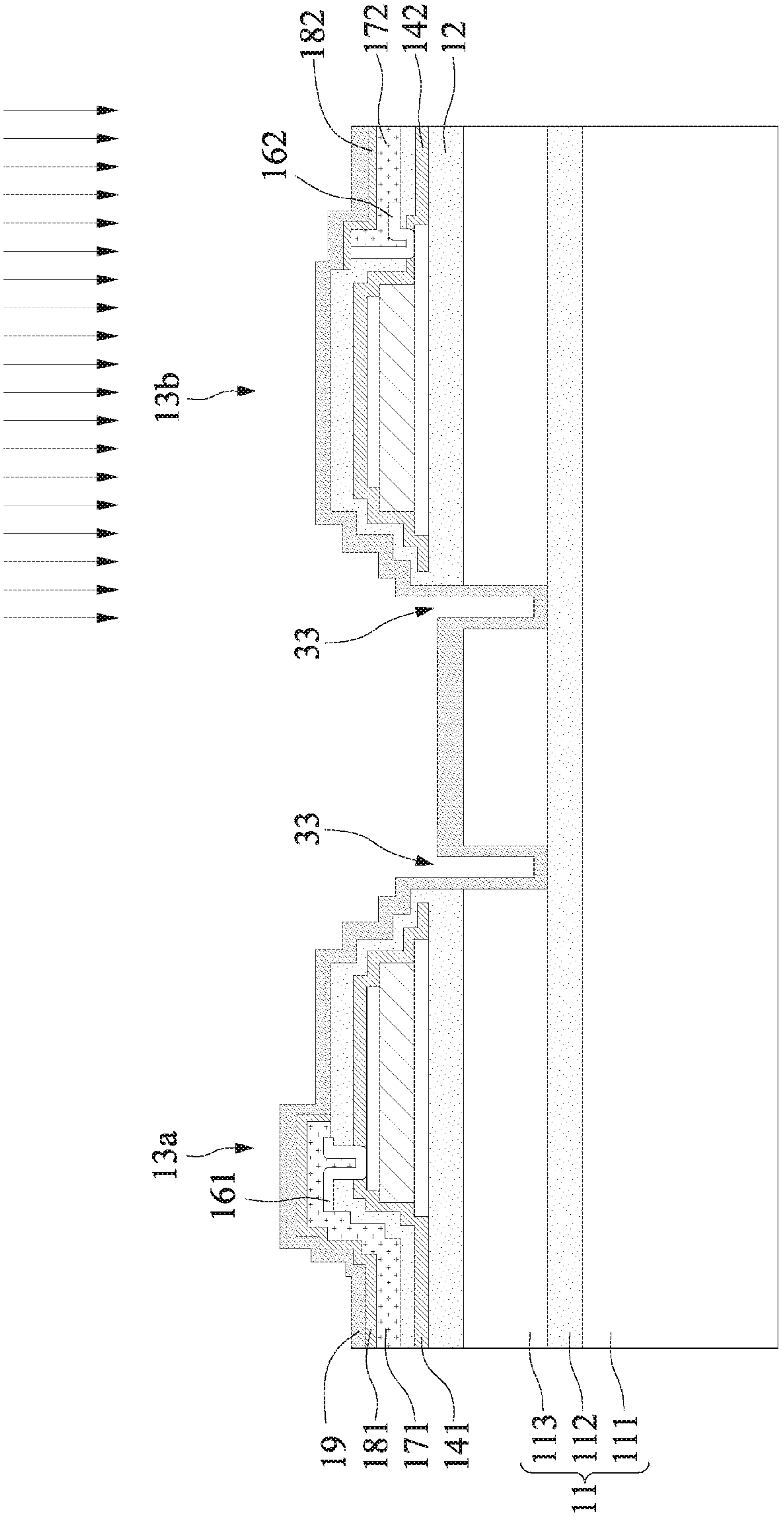
FIG. 25 is a schematic diagram at a stage of a method for manufacturing a semiconductor structure in accordance with different embodiments of the disclosure.

Referring to FIG. 25, a thermal operation is performed after the operations as depicted in FIG. 14. A heat source of the thermal operation may include a lamp, a laser source, or a combination thereof. The thermal operation may focus on only a portion of the dielectric layer 19. In some embodiments, the thermal operation targets on a portion of the dielectric layer 19 covering the piezoelectric capacitor 13*b*. The thermal operation can release a stress of the dielectric layer 19. In some embodiments, a stress of the portion of the dielectric layer 19 is reduced after the thermal operation. In some embodiments, a stress of the dielectric layer 19 prior to the thermal operation is in a range of −150 to −200 MegaPascal (MPa), and a stress of the portion of the dielectric layer 19 after the thermal operation is in a range of −50 to −100 MPa. The operations as depicted in FIGS. 15 and 16 are performed after the thermal operation, and a semiconductor structure similar to the semiconductor structure 10 as shown in FIG. 16 is formed.

Every of the above embodiments shown in FIGS. 18 to 25 include different stresses on the different piezoelectric capacitors surrounding the diaphragm portion 114. However, similar treatments or adjustments of stress can be provided on different chips formed on one wafer.

Figure 26:
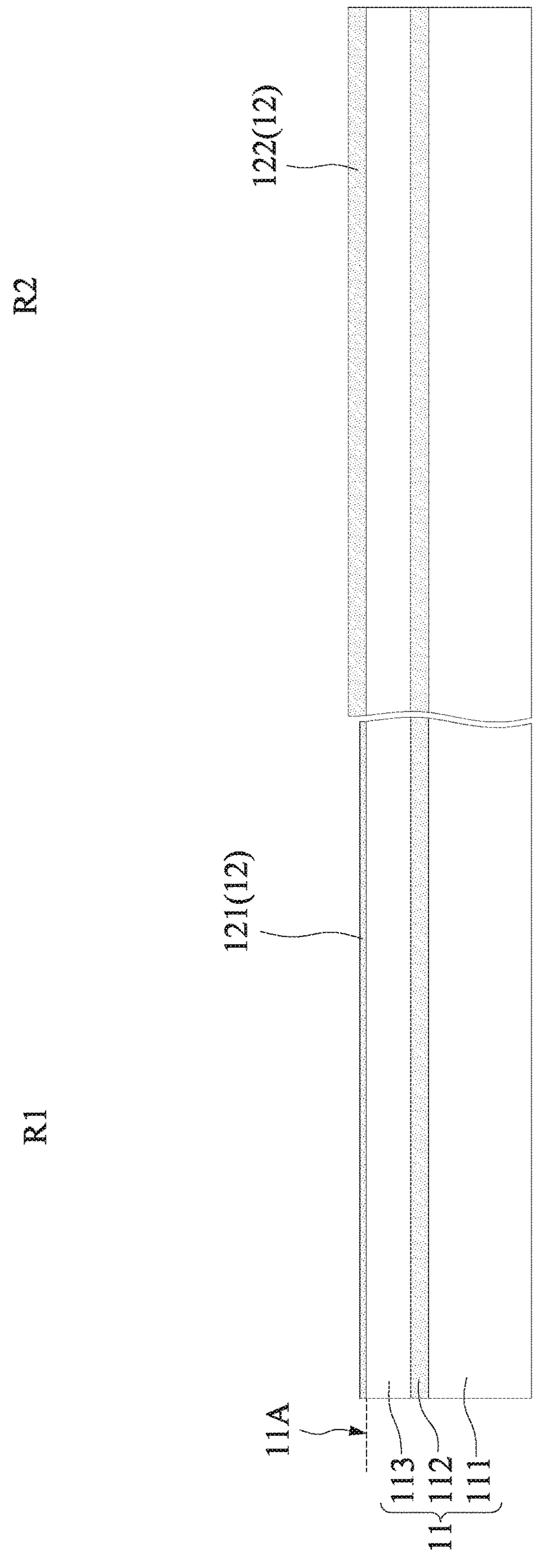
FIGS. 26 to 27 are schematic diagrams at different stages of a method for manufacturing a semiconductor structure in accordance with different embodiments of the disclosure.

Referring to FIG. 26, a thickness of a portion of the dielectric layer 12 is adjusted or changed after the formation of the dielectric layer 12 as depicted in FIG. 1. In some embodiments, the substrate 11 includes different regions R1 and R2. One of the regions R1 and R2 is a central region of the substrate 11, and the other one of the regions R1 and R2 is a peripheral region of the substrate 11, wherein the peripheral region surrounds the central region. In some embodiments, the substrate 11 defines a plurality of chips, and R1 and R2 represent different chips. For case of illustration, R1 and R2 are referred to as a first region R1 and a second region R2. The operations as depicted in FIG. 18 can be performed in one of the regions R1 and R2. In some embodiments, a thickness of a portion 121 of the dielectric layer 12 in the first region R1 is reduced. In some embodiments, a thickness of a portion 122 of the dielectric layer 12 in the second region R2 is increased. The method of the reduction or the increment in thickness of the dielectric layer 12 can be similar to those depicted in FIG. 18, and repeated description is omitted herein. In some embodiments, the thicknesses of the dielectric layer 12 in different regions R1 and R2 of the substrate 11 are adjusted due to center-edge non-uniformity of the process, and thus a stress of the dielectric layer 12 can be uniform across the substrate 11.

Figure 27:
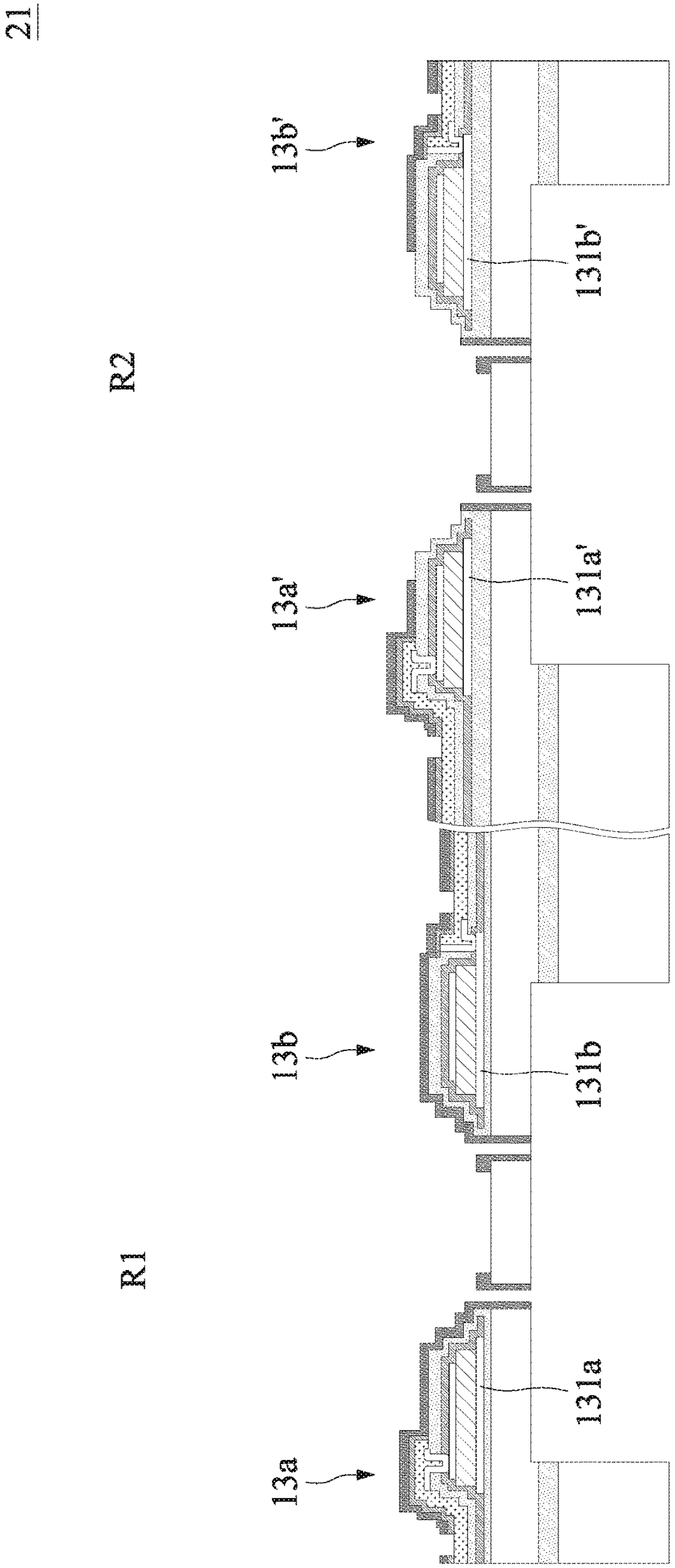

Referring to FIG. 27, operations as depicted in FIGS. 2 to 16 are performed on the intermediate structure shown in FIG. 26, and a semiconductor structure 21 is thereby formed. The semiconductor structure 21 may include repeated audio units similar to that shown in FIG. 16 in the region R1 and the region R2 respectively. In some embodiments, the audio unit formed in the region R1 includes piezoelectric capacitors 13*a* and 13*b*, and the audio unit formed in the region R2 includes piezoelectric capacitors 13*a*' and 13*b*'. In some embodiments, a distance between a bottom electrode 131*a* of the piezoelectric capacitor 13*a* and the substrate 11 is substantially equal to a distance between a bottom electrode 131*b* of the piezoelectric capacitor 13*b* and the substrate 11. In some embodiments, a distance between a bottom electrode 131*a* of the piezoelectric capacitor 13*a* and the substrate 11 is substantially less than a distance between a bottom electrode 131*a*' of the piezoelectric capacitor 13*a*' and the substrate 11.

Figure 28:
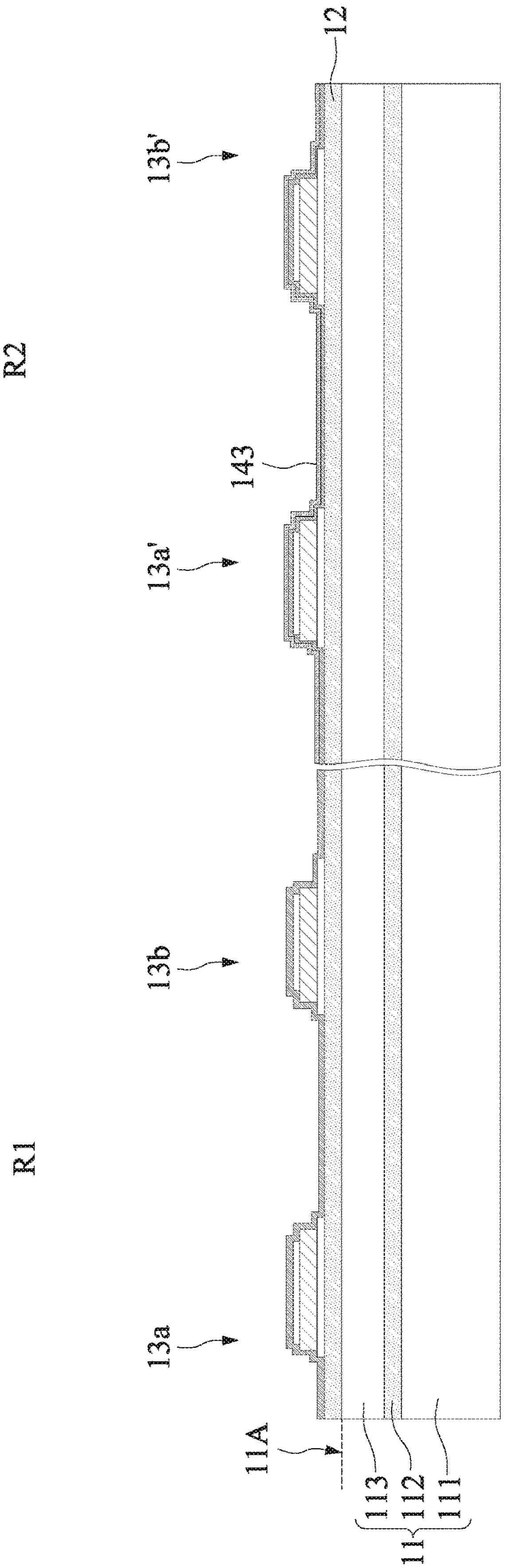
FIGS. 28 to 29 are schematic diagrams at different stages of a method for manufacturing a semiconductor structure in accordance with different embodiments of the disclosure.

Referring to FIG. 28, operations as depicted in FIG. 20 is performed in a region R2 of the substrate 11 instead of the portion of the high-k material layer 14 as depicted in FIG. 20. In some embodiments, a sub-layer 143 is formed over an entirety of the high-k material layer 14 in the region R2 conformal to piezoelectric capacitors 13*a*' and 13*b*'.

Figure 29:
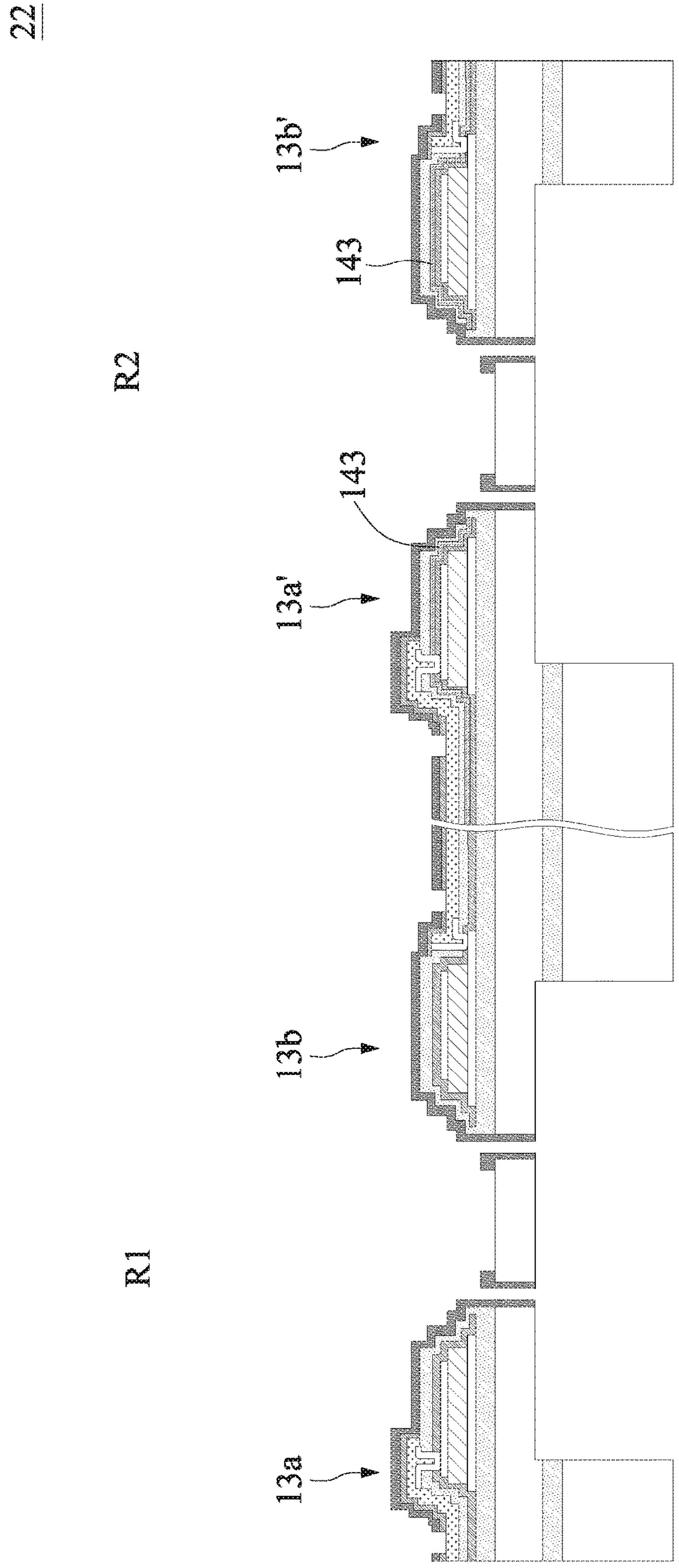

Referring to FIG. 29, operations as depicted in FIGS. 5 to 16 are performed on the intermediate structure shown in FIG. 28, and a semiconductor structure 22 is thereby formed. In some embodiments, the sub-layer 143 covers piezoelectric capacitors 13*a*' and 13*b*' in the region R2. In some embodiments, the sub-layer 143 covers all piezoelectric capacitors (including the piezoelectric capacitors 13*a*' and 13*b*') in the region R2.

Figure 30:
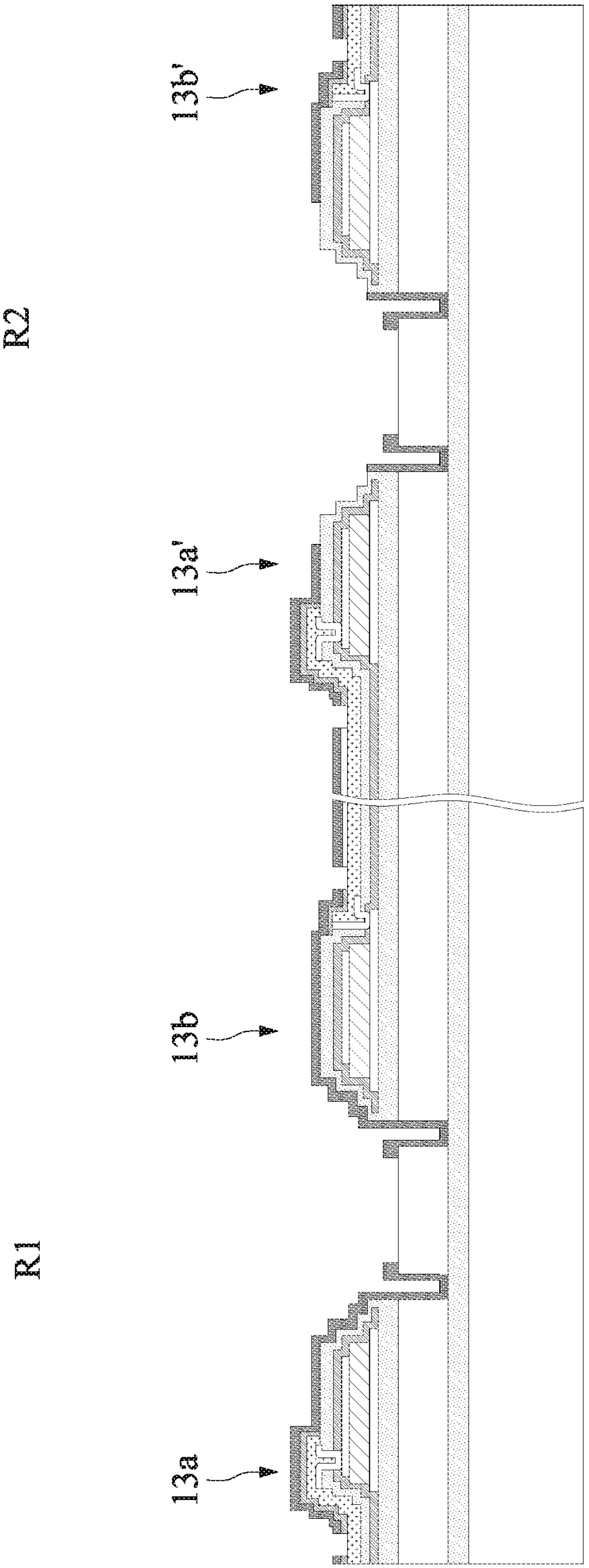
FIGS. 30 to 31 are schematic diagrams at different stages of a method for manufacturing a semiconductor structure in accordance with different embodiments of the disclosure.

Referring to FIG. 30, operations as depicted in FIG. 22 are performed on the dielectric layer 19 over multiple piezoelectric capacitors in a region R2. In some embodiments, every piezoelectric capacitor in the region R2 is partially covered by the dielectric layer 19. In some embodiments, portions of the dielectric layer 19 over piezoelectric capacitors 13*a*' and 13*b*' in the region R2 are removed. In some embodiments, a portion of the dielectric layer 19 over each of piezoelectric capacitors of one audio unit is removed.

Figure 31:
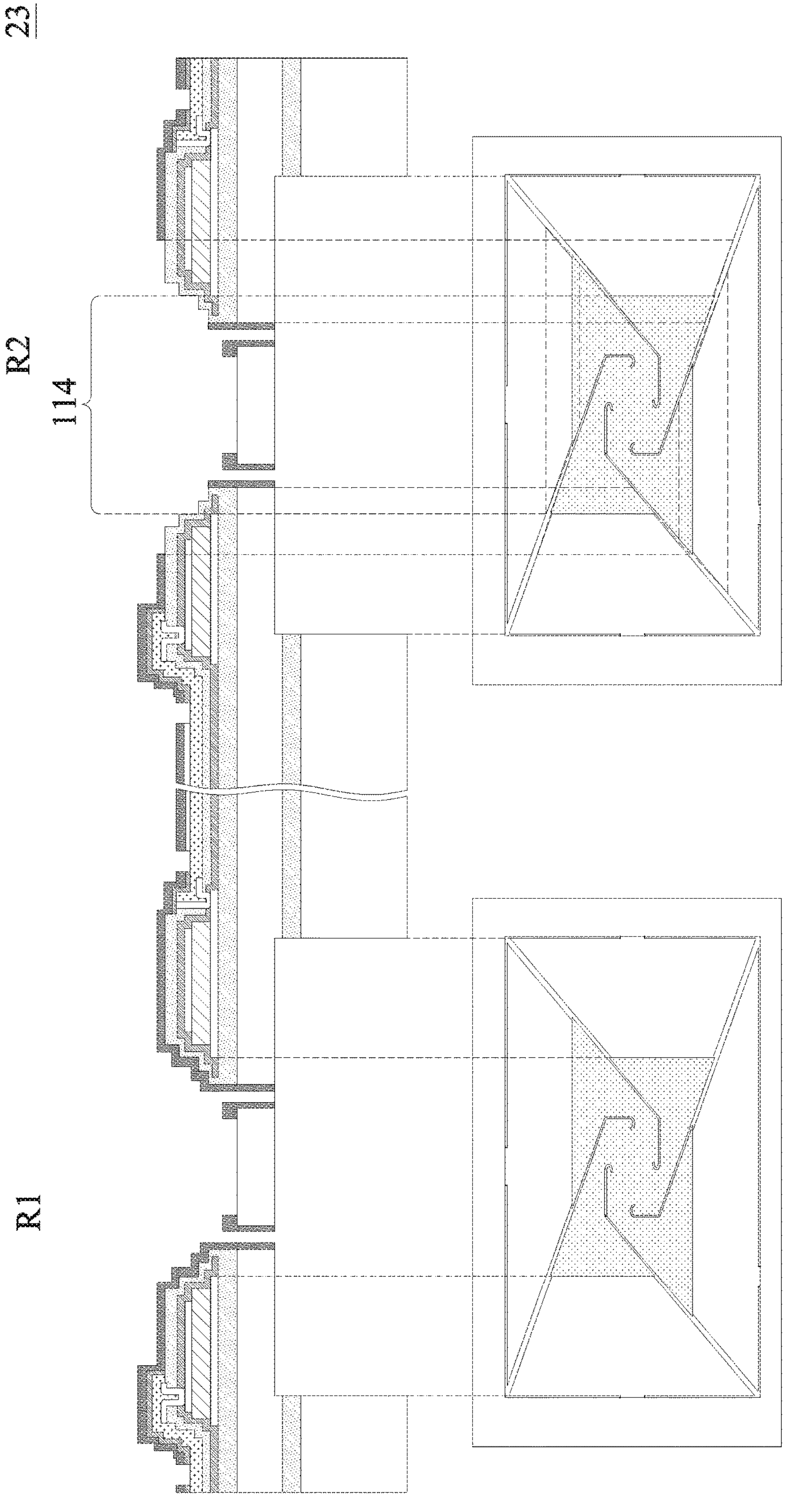

Referring to FIG. 31, operations as depicted in FIG. 16 are performed on the intermediate structure shown in FIG. 30, and a semiconductor structure 23 is thereby formed. FIG. 31 shows schematic cross sections in the regions R1 and R2 and respective top views. In some embodiments, portions of the dielectric layer 19 surrounding a diaphragm portion 114 are removed in the region R2. The removed portions of the dielectric layer 19 are shown in dotted lines in the schematic top views.

Figure 32:
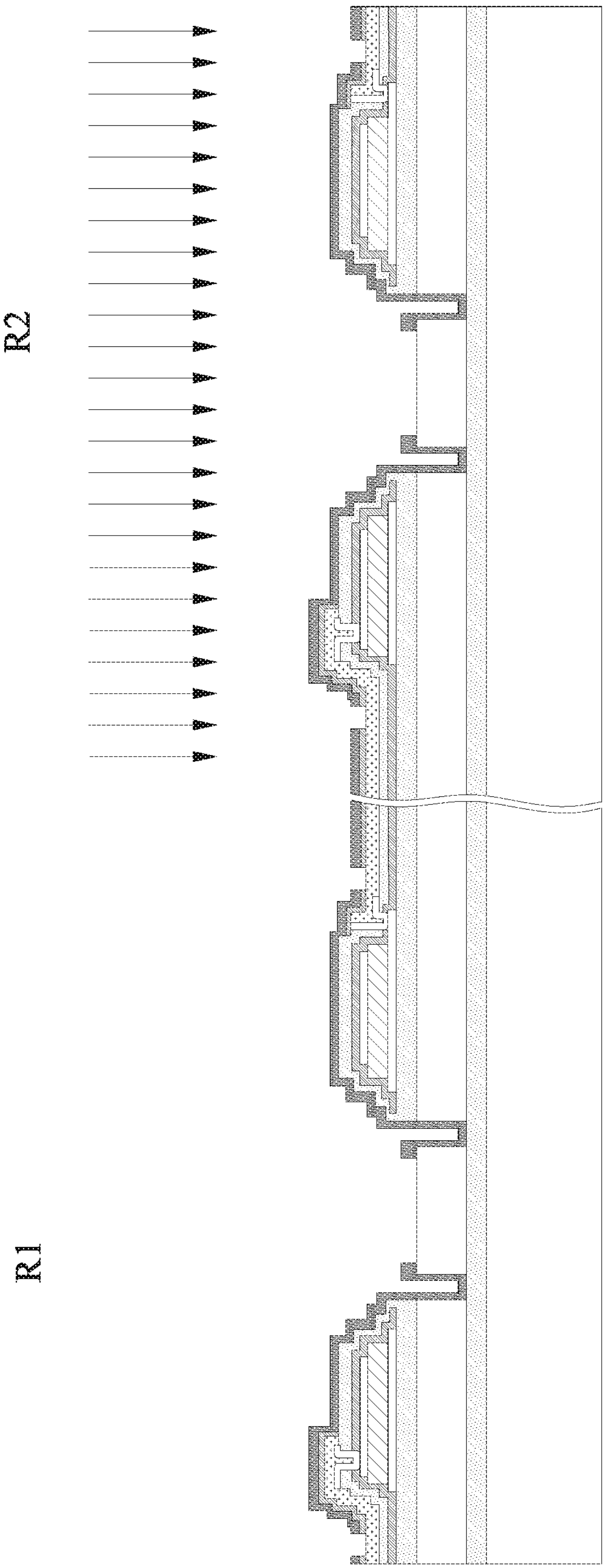
FIG. 32 is a schematic diagram at a stage of a method for manufacturing a semiconductor structure in accordance with different embodiments of the disclosure.

Referring to FIG. 32, the operations as depicted in FIG. 25 is performed on the dielectric layer 19 in the region R2. In some embodiments, the thermal operation targets to an entirety of the region R2. The operations as depicted in FIGS. 15 and 16 are performed after the thermal operation, and semiconductor structures similar to the semiconductor structure 10 as shown in FIG. 16 are formed in the regions R1 and R2.

A dicing operation can be performed after the operation as depicted in FIG. 16, and the substrate 11 is diced into chips. In some embodiments, a thickness of the dielectric layer 12 of a first chip in the region R1 is different from a thickness of the dielectric layer 12 of a second chip in the region R2 (as shown in FIG. 27). In some embodiments, a thickness of the high-k material layer 14 of a first chip in the region R1 is different from a thickness of the high-k material layer 14 of a second chip in the region R2 (as shown in FIG. 29). In some embodiments, a coverage area of the dielectric layer 19 of a first chip in the region R1 is different from a coverage of the dielectric layer 19 of a second chip in the region R2 (as shown in FIG. 31). In some embodiments, a stress of the dielectric layer 19 of a first chip in the region R1 is different from a stress of the dielectric layer 19 of a second chip in the region R2 (as shown in FIG. 32).

Figure 33:
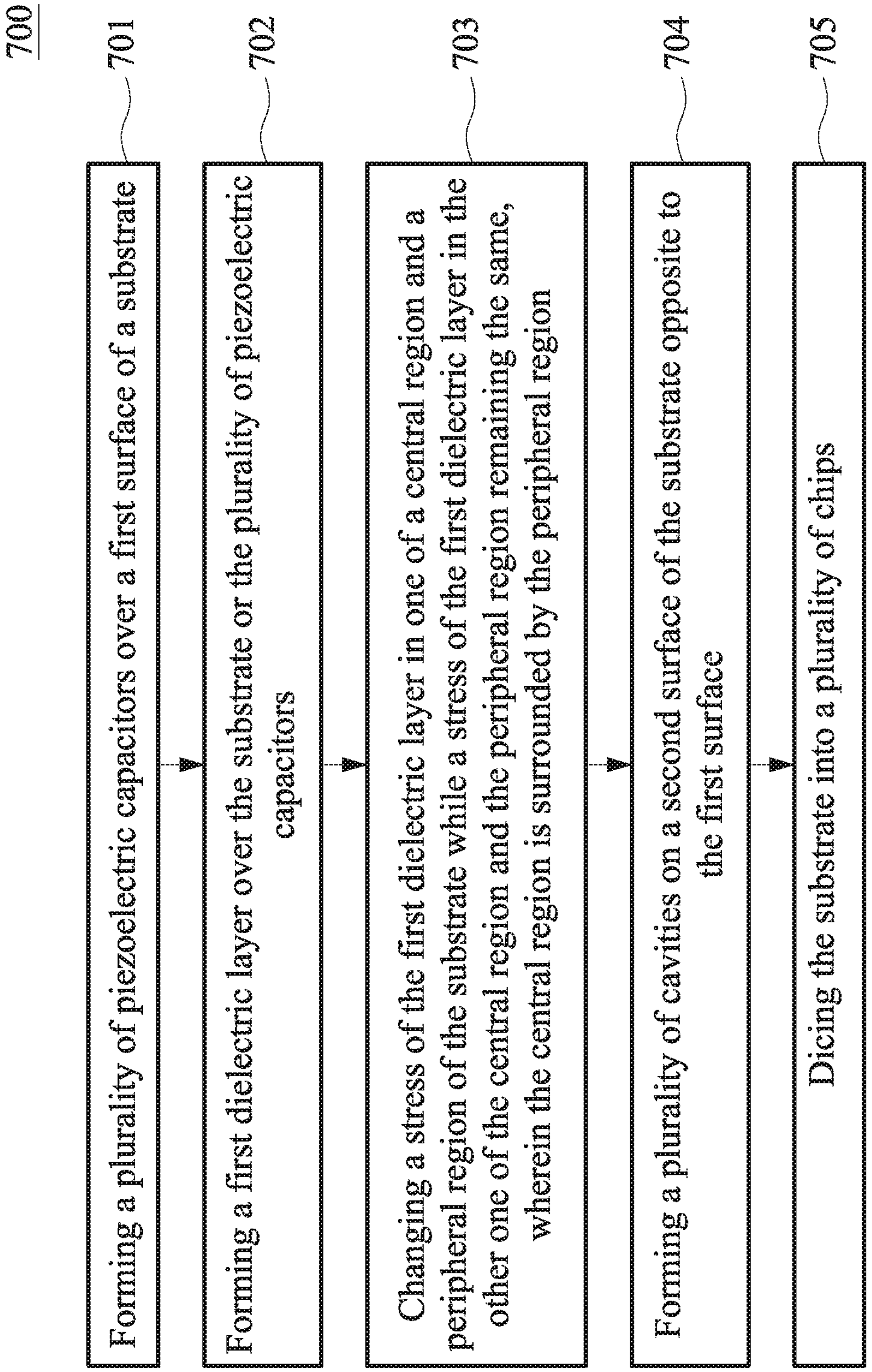
FIG. 33 is a flow diagram of a method for manufacturing a semiconductor structure in accordance with some embodiments of the disclosure.

To conclude the processes of different embodiments as illustrated above, the present disclosure provides a method 700. FIG. 33 is a flow diagram of the method 700 for manufacturing a semiconductor structure in accordance with some embodiments of the present disclosure. The method 700 includes a number of operations (701, 702, 703, 704 and 705) and the description and illustration are not deemed as a limitation to the sequence of the operations. A plurality of piezoelectric capacitors is formed over a first surface of a substrate in the operation 701. A first dielectric layer is formed over the substrate or the plurality of piezoelectric capacitors in the operation 702. A stress of the first dielectric layer in one of a central region and a peripheral region of the substrate is changed in the operation 703, and a stress of the first dielectric layer in the other one of the central region and the peripheral region remains the same, wherein the central region is surrounded by the peripheral region. A plurality of cavities is formed on a second surface of the substrate opposite to the first surface in the operation 704. The substrate is diced into a plurality of chips in the operation 705. It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

In accordance with some embodiments of the disclosure, a semiconductor structure is provided. The semiconductor structure includes: a substrate, having a first surface and a second surface opposite to the first surface, wherein a portion of the substrate proximal to the first surface defines a diaphragm; a piezoelectric layer, disposed over the first surface of the substrate and surrounding the diaphragm, wherein the piezoelectric layer includes a first portion and a second portion arranged along a periphery of the diaphragm from a top view; and a stress structure, including a plurality of dielectric layers disposed over the piezoelectric layer and between the substrate and the piezoelectric layer, and a total thickness of a first portion of the stress structure overlapping the first portion of the piezoelectric layer is different from a total thickness of a second portion of the stress structure overlapping the second portion of the piezoelectric layer.

In accordance with some embodiments of the disclosure, a semiconductor structure is provided. The semiconductor structure includes: a substrate, having a first surface and a second surface opposite to the top surface; a cavity, disposed on the second surface of the substrate, wherein a portion of the substrate at a bottom of the cavity defines a diaphragm portion and a cantilever portion surrounding the diaphragm portion, and a portion of the substrate surrounding the cavity defines an anchor portion; a piezoelectric capacitor, disposed over the first surface of the substrate and surrounding the diaphragm portion; a first dielectric layer, disposed over the piezoelectric capacitor; and a second dielectric layer, disposed over the first dielectric layer, wherein a portion of the first dielectric layer proximal to the diaphragm portion is exposed through the second dielectric layer from a top-view perspective.

In accordance with some embodiments of the disclosure, a method for manufacturing a semiconductor structure is provided. The method may include several operations. A plurality of piezoelectric capacitors is formed over a first surface of a substrate. A first dielectric layer is formed over the substrate or the plurality of piezoelectric capacitors. A stress of the first dielectric layer in one of a central region and a peripheral region of the substrate is changed, and a stress of the first dielectric layer in the other one of the central region and the peripheral region remains the same, wherein the central region is surrounded by the peripheral region. A plurality of cavities is formed on a second surface of the substrate opposite to the first surface. The substrate is diced or cut into a plurality of chips.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:

a substrate, having a first surface and a second surface opposite to the first surface, wherein a portion of the substrate proximal to the first surface defines a diaphragm;

a piezoelectric layer, disposed over the first surface of the substrate and surrounding the diaphragm, wherein the piezoelectric layer includes a first portion and a second portion arranged along a periphery of the diaphragm from a top view; and a stress structure, including a plurality of dielectric layers disposed over the piezoelectric layer and between the substrate and the piezoelectric layer, and a total thickness of a first portion of the stress structure overlapping the first portion of the piezoelectric layer is different from a total thickness of a second portion of the stress structure overlapping the second portion of the piezoelectric layer.

2. The semiconductor structure of claim 1, wherein the stress structure includes a dielectric layer disposed between the piezoelectric layer and the substrate, a first portion of the dielectric layer is overlapped by the first portion of the piezoelectric layer, a second portion of the dielectric layer is overlapped by the second portion of the piezoelectric layer, and a thickness of the first portion of the dielectric layer is different from a thickness of the second portion of the dielectric layer.

3. The semiconductor structure of claim 1, wherein a bottom surface of the first portion of the piezoelectric layer is at an elevation different from an elevation of a bottom surface of the second portion of the piezoelectric layer.

4. The semiconductor structure of claim 1, wherein the stress structure includes a dielectric layer disposed over the piezoelectric layer, a first portion of the dielectric layer covers the first portion of the piezoelectric layer, a second portion of the dielectric layer covers the second portion of the piezoelectric layer, and a thickness of the first portion of the dielectric layer is different from a thickness of the second portion of the dielectric layer.

5. The semiconductor structure of claim 1, wherein a number of the dielectric layers of the stress structure overlapping the first portion of the piezoelectric layer is different from a number of the dielectric layers of the stress structure overlapping the second portion of the piezoelectric layer.

6. The semiconductor structure of claim 1, wherein a stress provided by the first portion of the stress structure is different from a stress provided by the second portion of the stress structure.

7. The semiconductor structure of claim 1, wherein the stress structure includes at least one oxide layer and at least one nitride layer.

8. A semiconductor structure, comprising:

a substrate, having a first surface and a second surface opposite to the first surface;

a cavity, disposed on the second surface of the substrate, wherein a portion of the substrate at a bottom of the cavity defines a diaphragm portion and a cantilever portion surrounding the diaphragm portion, and a portion of the substrate surrounding the cavity defines an anchor portion;

a piezoelectric capacitor, disposed over the first surface of the substrate and surrounding the diaphragm portion;

a first dielectric layer, disposed over the piezoelectric capacitor; and a second dielectric layer, disposed over the first dielectric layer, wherein a portion of the first dielectric layer proximal to the diaphragm portion is exposed through the second dielectric layer from a top-view perspective.

9. The semiconductor structure of claim 8, wherein a sidewall of the piezoelectric capacitor proximal to the diaphragm portion is exposed through the second dielectric layer.

10. The semiconductor structure of claim 8, wherein the first dielectric layer covers a sidewall of the piezoelectric capacitor proximal to the diaphragm portion.

11. The semiconductor structure of claim 8, further comprising:

a high-k layer, disposed between the piezoelectric capacitor and the first dielectric layer, wherein the high-k layer covers sidewalls of the piezoelectric capacitor.

12. The semiconductor structure of claim 8, wherein the second dielectric layer covers only a portion of the cantilever portion proximal to the anchor portion from the top-view perspective.

13. The semiconductor structure of claim 8, wherein the piezoelectric capacitor covers partial of the cantilever portion and partial of the anchor portion from the top-view perspective.

14. The semiconductor structure of claim 8, wherein the diaphragm portion is in a rectangular shape from a top view perspective, the piezoelectric capacitor includes four portions on four sides of the rectangular shape of the diaphragm portion, and coverage areas of the second dielectric layer on the four portions of the piezoelectric capacitor are different.

15. A method of manufacturing a semiconductor structure, comprising:

forming a plurality of piezoelectric capacitors over a first surface of a substrate;

forming a first dielectric layer over the substrate or the plurality of piezoelectric capacitors;

changing a stress of the first dielectric layer in one of a central region and a peripheral region of the substrate while a stress of the first dielectric layer in the other one of the central region and the peripheral region remaining the same, wherein the central region is surrounded by the peripheral region;

forming a plurality of cavities on a second surface of the substrate opposite to the first surface; and dicing the substrate into a plurality of chips.

16. The method of claim 15, wherein the first dielectric layer is formed over the substrate prior to the formation of the plurality of piezoelectric capacitors, and the change of the stress of the first dielectric layer comprises:

removing a portion of the first dielectric layer in the central region of the substrate, thereby reducing a thickness of the first dielectric layer in the central region; or depositing a sub-layer of the first dielectric layer in the central region of the substrate, thereby increasing the thickness of the first dielectric layer in the central region of the substrate.

17. The method of claim 15, wherein the first dielectric layer is formed over the plurality of piezoelectric capacitors, and the change of the thickness of the first dielectric layer comprises:

depositing a sub-layer of the first dielectric layer in the central region of the substrate, thereby increasing the thickness of the first dielectric layer in the central region.

18. The method of claim 17, wherein the first dielectric layer includes at least a high-k material, and the first dielectric layer covers an entirety of the plurality of piezoelectric capacitors.

19. The method of claim 15, wherein the first dielectric layer is formed over the plurality of piezoelectric capacitors, and the change of the thickness of the first dielectric layer comprises:

removing a portion of the first dielectric layer in the central region or the peripheral region of the substrate.

20. The method of claim 15, wherein the first dielectric layer is formed over the plurality of piezoelectric capacitors, and the change of the thickness of the first dielectric layer comprises:

performing a thermal treatment targeting the first dielectric layer only in the central region or the peripheral region of the substrate.

* * * * *